(12) United States Patent
Cheng et al.

(10) Patent No.: US 9,053,946 B2
(45) Date of Patent: Jun. 9, 2015

(54) MOSFET WITH RECESSED CHANNEL FILM AND ABRUPT JUNCTIONS

(71) Applicant: International Business Machines Corporation, Armonk, NY (US)

(72) Inventors: Kangguo Cheng, Schenectady, NY (US); Bruce B. Doris, Singerlands, NY (US); Pranita Kerber, Slingerlands, NY (US); Ali Khakifirooz, Mountain View, CA (US)

(73) Assignee: International Business Machines Corporation, Armonk, NY (US)

( * ) Notice: Subject to any disclaimer, the term of this patent is extended or adjusted under 35 U.S.C. 154(b) by 51 days.

(21) Appl. No.: 14/059,915

(22) Filed: Oct. 22, 2013

(65) Prior Publication Data

US 2014/0042521 A1 Feb. 13, 2014

Related U.S. Application Data

(60) Division of application No. 13/606,816, filed on Sep. 7, 2012, now Pat. No. 8,629,502, which is a continuation of application No. 13/086,459, filed on Apr. 14, 2011, now Pat. No. 8,691,650.

(51) Int. Cl.
*H01L 27/12* (2006.01)
*H01L 29/66* (2006.01)
(Continued)

(52) U.S. Cl.
CPC ........ *H01L 29/0603* (2013.01); *H01L 29/4236* (2013.01); *H01L 29/66545* (2013.01); *H01L 29/66553* (2013.01); *H01L 29/66621* (2013.01);
(Continued)

(58) Field of Classification Search
CPC ............ H01L 29/0603; H01L 29/1054; H01L 29/4236; H01L 29/66545; H01L 29/66553; H01L 29/66621; H01L 29/66628; H01L 29/66651; H01L 29/66772; H01L 29/78
USPC .................. 257/347, 336, 344, 408, E27.112, 257/E29.012, E29.278
See application file for complete search history.

(56) References Cited

U.S. PATENT DOCUMENTS 6,509,234 B1   1/2003   Krivokapic
6,855,987 B2   2/2005   Mimura et al.
(Continued)

OTHER PUBLICATIONS

K. Cheng, et al, "Extremely Thin SOI(ETSOI) CMOS with Record Low Variability for Low Power System-on-Chip Applications," 2009 IEEE Int. Elec. Dev. Meeting; Dec. 2009, pp. 1-4.
(Continued)

*Primary Examiner* — Jesse Y Miyoshi
(74) *Attorney, Agent, or Firm* — Cantor Colburn LLP; Vazkan Alexanian

(57) ABSTRACT

MOSFETs and methods for making MOSFETs with a recessed channel and abrupt junctions are disclosed. The method includes creating source and drain extensions while a dummy gate is in place. The source/drain extensions create a diffuse junction with the silicon substrate. The method continues by removing the dummy gate and etching a recess in the silicon substrate. The recess intersects at least a portion of the source and drain junction. Then a channel is formed by growing a silicon film to at least partially fill the recess. The channel has sharp junctions with the source and drains, while the unetched silicon remaining below the channel has diffuse junctions with the source and drain. Thus, a MOSFET with two junction regions, sharp and diffuse, in the same transistor can be created.

4 Claims, 19 Drawing Sheets

(51) Int. Cl.
*H01L 29/06* (2006.01)
*H01L 29/423* (2006.01)
*H01L 29/78* (2006.01)
*H01L 29/10* (2006.01)

(52) U.S. Cl.
CPC .... *H01L 29/66628* (2013.01); *H01L 29/66651* (2013.01); *H01L 29/1054* (2013.01); *H01L 29/66772* (2013.01); *H01L 29/78* (2013.01)

(56) References Cited

U.S. PATENT DOCUMENTS

| | | |
|---|---|---|
| 6,939,751 B2 | 9/2005 | Zhu et al. |
| 7,034,361 B1 | 4/2006 | Yu et al. |
| 7,041,538 B2 | 5/2006 | Ieong et al. |
| 7,429,769 B2 | 9/2008 | Diaz et al. |
| 7,652,332 B2 | 1/2010 | Cartier et al. |
| 8,263,468 B2 | 9/2012 | Adam et al. |
| 2003/0006459 A1 | 1/2003 | Adkisson et al. |
| 2003/0168700 A1 | 9/2003 | Mimura et al. |
| 2005/0112811 A1 | 5/2005 | Hsu et al. |
| 2005/0116289 A1 | 6/2005 | Boyd et al. |
| 2006/0001095 A1 | 1/2006 | Doris et al. |
| 2007/0069300 A1 | 3/2007 | Cheng et al. |
| 2007/0298561 A1 | 12/2007 | Jumpertz et al. |
| 2008/0283918 A1 | 11/2008 | Cheng et al. |
| 2010/0237410 A1 | 9/2010 | Zhu et al. |

OTHER PUBLICATIONS

Bruce B. Doris, et al., "FDSOI for Low Power CMOS," IBM Research; IBM Corporation, 2009, pp. 1-47.
Bruce B. Doris, et al., "Ultra-Thin SOI Replacement Gate CMOS with ALD TaN/ High-k Gate Stack," VLSI, 2005 IEEE VLSI-TSA International Symposium on VLSI Technology; Proceedings of Technical Papers, IEEE, 2005, pp. 101-102.
Jack Kavalieros, et al., "Tri-Gate Transistor Architecture with High-k Gate Dielectrics, Metal Gates and Strain Engineering," VLSI Technology, Symposium on Digest of Technical Papers, 2006, pp. 1-2.
David Lammers, "CMOS Transitions to 22 and 15 nm," Semiconductor International; 2010, pp. 1-9.
U.S. Appl. No. 13/086,459; Non-Final Office Action; Date Filed: Apr. 14, 2011; Date Mailed: Jun. 18, 2013; pp. 1-14.
U.S. Appl. No. 13/606,816; Non-Final Office Action; Date Filed: Sep. 7, 2012; Date Mailed: Feb. 28, 2013; pp. 1-13.
International Search Report; International Application No. PCT/US2012/27930; International Filing Date: Mar. 7, 2012; Date of Mailing: Jul. 5, 2012; pp. 1-5.
International Search Report—Written Opinion; International Application No. PCT/US2012/27930; International Filing Date: Mar. 7, 2012; Date of Mailing: Jul. 5, 2012; pp. 1-7.

US 9,053,946 B2

MOSFET WITH RECESSED CHANNEL FILM AND ABRUPT JUNCTIONS

CROSS-REFERENCE TO RELATED APPLICATION

This application is a divisional of U.S. patent application Ser. No. 13/606,816, filed Sep. 7, 2012, which is a continuation application of U.S. patent application Ser. No. 13/086,459, filed Apr. 14, 2011, the disclosure of which is incorporated by reference herein in its entirety.

BACKGROUND OF THE INVENTION

1. Field of the Invention

The present invention generally relates to a Metal Oxide Semiconductor Field Effect Transistors (MOSFETs) made on semiconductor on insulator (SOI) substrates. In particular, the invention relates to MOSFETs with a recessed channel film in an SOI layer. The recessed channel film forms an abrupt junction.

2. Description of Related Art

U.S. Pat. No. 7,041,538 B2, issued on May 9, 2006 to Ieong et al., describes a high performance CMOS device on an SOI substrate with a gate recessed into an SOI layer and ion implanted source/drain regions with halo and extension implants.

U.S. Pat. No. 6,939,751 B2 issued on Sep. 6, 2005 to Zhu et al. describes a raised source drain field effect devices with a channel recessed into a silicon germanium film located above a SOI layer.

U.S. Pat. No. 7,652,332 B2 issued on Jan. 26, 2010 to Cartier et al. describes extremely thin silicon on insulator transistor with raised source/drain, high dielectric constant (high-k) oxide and metal gate.

U.S. Pat. No. 7,429,769 B2 issued on Sep. 30, 2008 to Diaz et al. describes a recessed channel field effect transistor (FET).

In a paper entitled "Extremely Thin SOI (ETSOI) CMOS with Record Low Variability for Low Power System-on-Chip Applications," by K. Cheng et al. published in 2009 IEEE International Electron Device Meeting, Dec. 7-9, 2009 a method of making CMOS transistors on ETSOI substrates is disclosed.

In a paper entitled "Ultra-thin SOI replacement gate CMOS with ALD TaN/high-k gate stack," by B. Doris et al. in IEEE VLSI-TSA International Symposium on VLSI Technology, Apr. 25-27, 2005 a device built on an ETSOI substrate using a replacement gate substrate is disclosed.

In a presentation by B. Doris et al., entitled "FD SOI for Low Power CMOS," 2009, available at http://www.soiconsortium.org/pdf/fullydepletedsoi/FD%20SOI%20for%20Low%20Power%20CMOS.pdf, a summary of device performance challenges and possible solutions are reviewed. Some possible solutions include various devices made using ETSOI substrates.

In a paper entitled "CMOS Transitions to 22 and 15 nm," by D. Lammers published Jan. 1, 2010, in Semiconductor International describes device structures and possible methods of manufacture for FETs at ground rules less than or equal to 22 nm. Possible devices include planar MOSFETs on ETSOI substrates.

In a paper entitled "Tri-Gate Transistor Architecture with High-k Gate Dielectrics, Metal Gates and Strain Engineering," by J. Kavalieros et al. available at http://download.intel.com/technology/silicon/tri-gate_paper_VLSI_0606.pdf, the authors describe a non-planar MOSFET on SOI with recessed source and drains.

BRIEF SUMMARY OF THE INVENTION

An object of the invention is to provide a method for making MOSFETs on SOI substrates. The method includes a replacement gate process on the SOI layer of the substrate in which raised source drains or ion implanted source drains are formed. At this point, the source and drains have diffuse junctions. An insulator is placed over the substrate and then the dummy gate removed to expose a portion of the SOI layer. Next, the SOI layer is recessed so as to remove part of the SOI layer and to leave a remaining portion of the SOI layer. The recess process also removes a portion of the diffuse junction. In the recess, a channel film is formed resulting in a sharp junction between the source drain doped area of the substrate and the channel film. Finally a high dielectric constant material and metal gate are formed.

According to an another aspect of the invention, an SOI substrate has a doped source and drain, a channel film between the doped source and drain and a remaining SOI layer under the channel film.

According to a further aspect of the invention, a MOSFET has a SOI substrate with a doped source and drain and a recessed channel film disposed between them. The channel film is above a remaining SOI layer. An insulator layer with an opening is over the substrate. A high dielectric constant material lines the opening in the insulator and a metal gate fills the opening.

An advantage of the current invention is improved short channel control. In particular, a short channel effect known as drain induced barrier lowering (DIBL) is improved with the current invention. Ideally, the gate completely controls the on/off state of a transistor, but in reality, the drain also has an influence. The influence of the drain in controlling the on/off state of the transistor is called DIBL. In a desired state, the drain control over the on/off state of a transistor is minimal, and thus ideally, for long channel devices DIBL equals 0 mV. TCAD simulations of DIBL of a short-channel device with a gate length of 25 nm show a value of 106 mV for the current invention versus 172 mV for an ETSOI structure without the benefit of the current invention. Thus the transistor with the current invention more closely approaches the ideal DIBL.

Another advantage of the current invention over other techniques is improved device drive current. With the current invention, simulations show that, at a comparable transistor off current ($I_{off}$), the on current ($I_{on}$) can be roughly 17% higher with the current sharp junction invention versus traditional thin filmed SOI structures.

Other characteristics and advantages of the invention will become obvious in combination with the description of accompanying drawings, wherein the same number represents the same or similar parts in all figures.

DETAILED DESCRIPTION OF THE INVENTION

The basic principle of the invention is a method for creating sharp junctions in MOSFET transistors. The method will be described in conjunction with FIG. 1 and FIGS. 2A-2S. The invention also includes a structure with a recessed channel and sharp junctions as will be described in conjunction with FIGS. 3-5. The terms sharp and abrupt are used interchangeably in this document. A detailed description of the invention is made in combination with the following embodiments.

Methods of Making with Recessed Channels and Sharp Junctions

Figure 1:
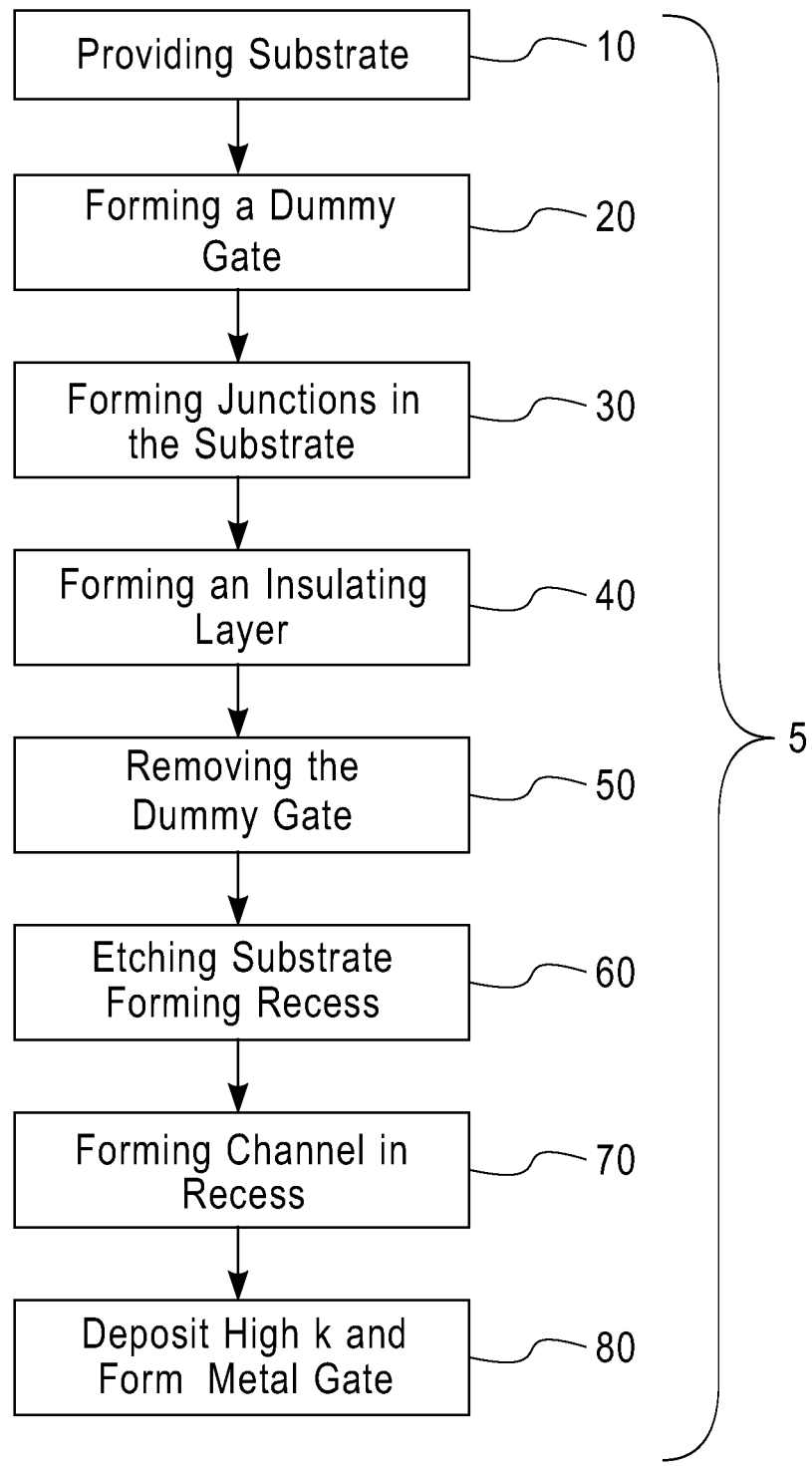
FIG. 1 is a flow chart of the steps to create a MOSFET with recessed channel and abrupt junctions according to an embodiment of this invention.

FIG. 1 is a flow chart 5 with the steps of creating a MOSFET with recessed channel and abrupt junctions according to one embodiment. Step 10 is providing a substrate, the step 20 is forming a dummy gate on the substrate; the step 30 is forming junctions in the substrate; the step 40 is forming an insulating layer; step 50 is removing the dummy gate to expose a portion of the substrate between the junctions; step 60 is etching the exposed portion of the substrate to form a recess; step 70 is forming epitaxial layer (also referred to as "epi") containing silicon in the recess to make a channel; the eight step 80 is depositing a high dielectric constant material (herein, "high-k") and forming a gate stack. Each of the steps will be discussed in detail below. Those skilled in the art will recognize that the step number (10, 20, 30, etc.) does not necessarily indicate an order to perform the step; rather the step numbers are a means of step identification.

Providing a Substrate

Figure 2A:
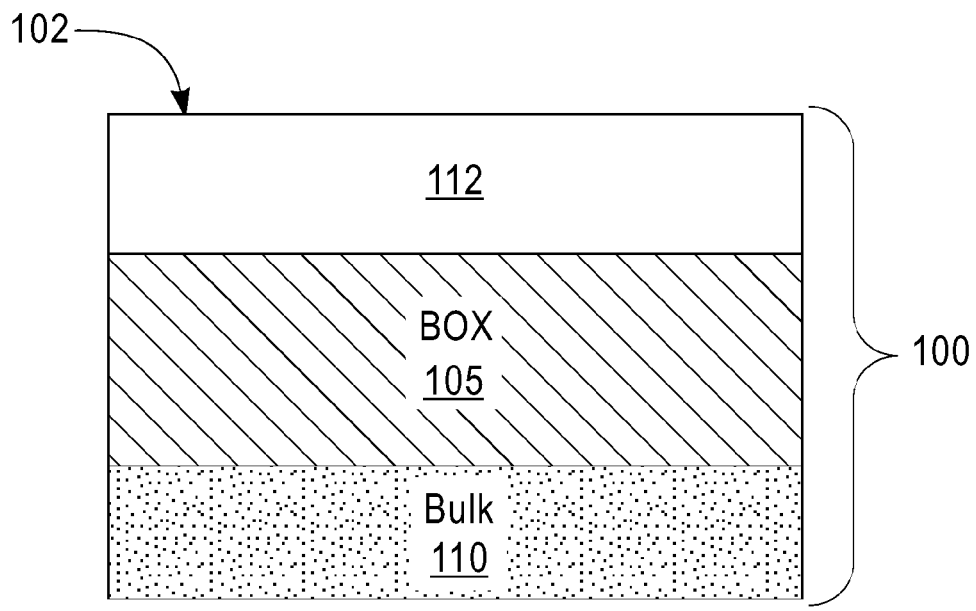
FIG. 2A is a first step of the method illustrating an SOI substrate according to an embodiment of the invention.

Step 10 of creating a MOSFET with sharp or abrupt junctions is providing a substrate 100 as shown in FIG. 2A. The substrate 100 can be a semiconductor on insulator substrate (SOI), and preferably an extremely thin semiconductor on insulator substrate (ETSOI).

All SOI substrates, are made of three parts: a bottom bulk semiconductor 110 section, a buried insulator 105 section (referred to as "BOX"), and a semiconductor layer 112 on top of the BOX 105. In this application, the semiconductor on top of the BOX is referred to as "SOI" 112 or "SOI layer" 112. In this application, the SOI substrate as a whole (i.e. all three layers: bulk 105, BOX 110 and SOI 112) is referred to as "SOI substrate" 100. Note, with an SOI substrate 100, a top surface of the substrate 102 is equivalent to the top surface of the SOI 112 layer.

Continuing with FIG. 2A, the BOX 105 may be formed from an implantation process or a bonding process. Typically, the insulating layer of the BOX is an oxide, preferably silicon dioxide. The SOI 112 layer, can be silicon, silicon doped with conventional 'n' or 'p' dopants, silicon germanium (SiGe), silicon germanium carbon (SiGeC), silicon carbon (SiC), III-V semiconductor compounds (for example $In_{1-x}Ga_xAs$, InP, GaAs) or other variations. The thickness of the SOI layer 112 can vary. A thickness of an SOI layer 112 of an ETSOI substrate may be 2 nm to 50 nm, but is preferably 2 nm to 20 nm or any other range in between.

Making a Dummy Gate

Figure 2B:
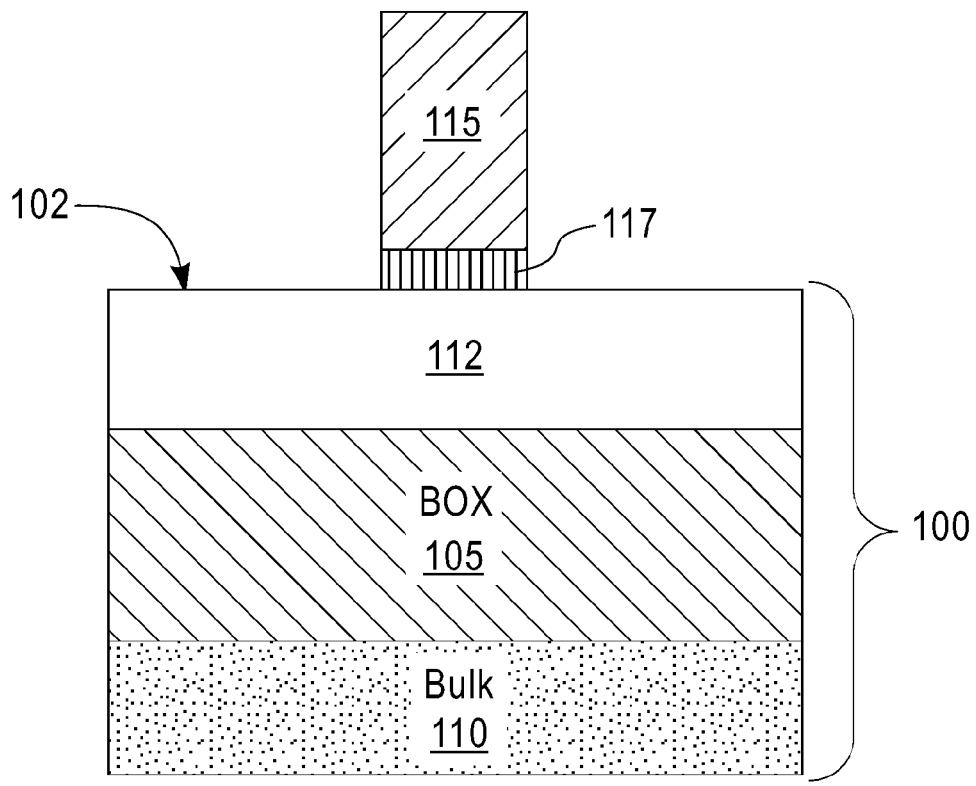
FIG. 2B is a second step of the method illustrating an SOI substrate with a dummy gate according to an embodiment of the invention.

Step 20 in forming a MOSFET with sharp or abrupt junctions is making a dummy gate. FIG. 2B shows the SOI substrate 100 with a dummy gate 115 formed using conventional patterning techniques. While the dummy gate 115 is shown as a single rectangle, it is preferably composed of multiple materials, and even more preferably, the materials are stacked in layers. For example, the dummy gate may be formed of silicon nitride ($Si_xN_yH_z$) on top of a thin oxide (preferably $Si_xO_yH_z$); or a nitride cap ($Si_xN_yH_z$) on polysilicon. In either case, a dummy gate dielectric 117 (preferably $Si_xO_yH_z$) may be between the dummy gate 115 and the SOI layer 112. Other variants of the materials and ordering of the layers are also acceptable as long as the final (top) layer of the dummy gate 115 has sufficient stopping (etch or CMP) properties. The overall height of the dummy gate may range from 20 nm to 100 nm or any other range in between. In an embodiment in which raised source/drains are used, the overall height of the dummy gate (sum of height of dummy gate dielectric 117, if any, and dummy gate 115) must exceed the height of the raised source/drains. Typically, the overall gate height exceeds the raised source drains by 5 nm to 40 nm or any other range in between. Preferably, the overall gate height exceeds the raised source drain height by 15 nm to 30 nm. Note, the height of the raised source drains can range from 10 nm to 50 nm or any other range in between, and is preferably from 20 nm to 30 nm.

Forming Junctions

Figure 2C:
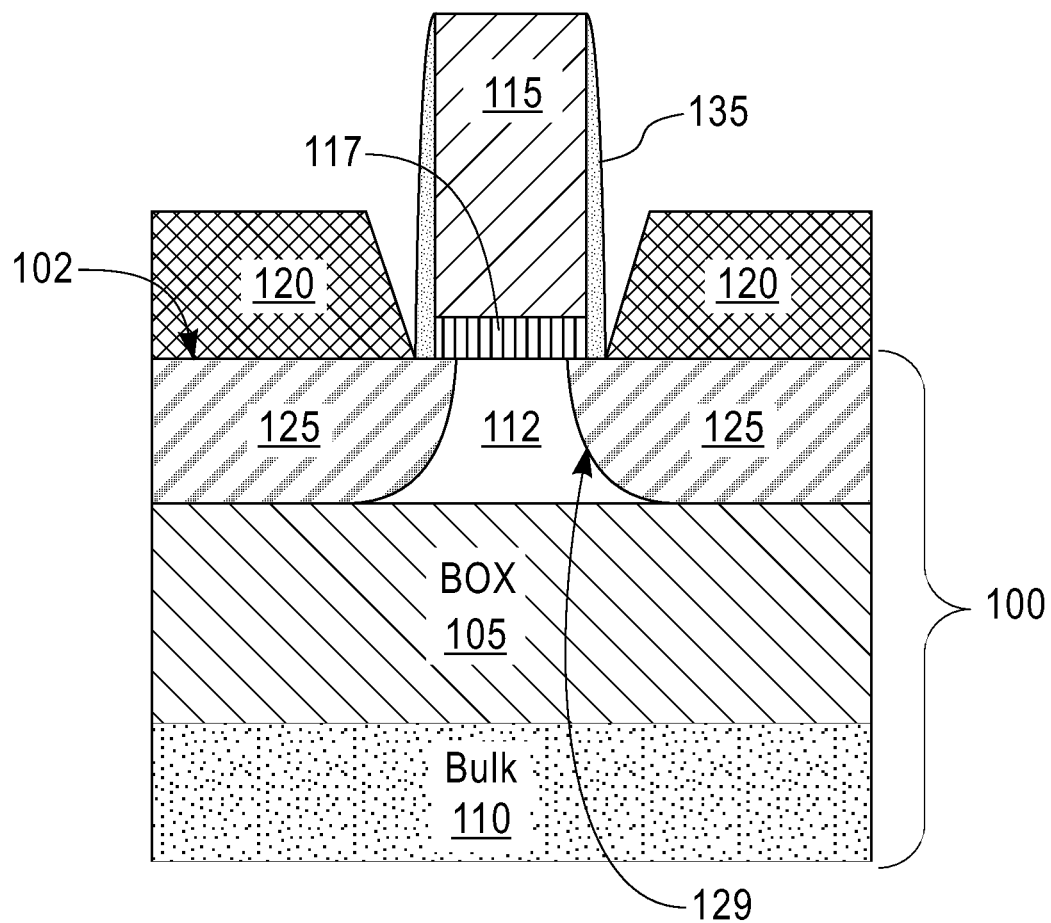
FIG. 2C is a third step of the method illustrating an SOI substrate with a dummy gate according to an embodiment of the invention.

Referring to FIG. 2C, the third step 30 of making a MOSFET with sharp junctions involves forming junctions. Generally speaking, a junction 129 is where two areas of dissimilar doping meet. The doping difference can be in the type of dopant (n or p, for example), or in terms of dopant concentration levels (heavily doped versus lightly), or both.

To form a junction, doped source and drains are made. There are many ways to make a source and a drain, including, but not limited to: (1) growing an in-situ doped raised source and drain followed by annealing; (2) implanting ions into a substrate followed by annealing; (3) growing a raised source and drain, implanting ions into the raised source and drain, followed by annealing, and (4) any suitable combination of those ways. Any of the methods may employ optional off-set spacers 135 formed on the sidewalls of the dummy gate prior to source/drain formation. The optional off-set spacers 135 can be made from silicon nitride ($Si_xN_yH_z$), silicon oxides ($SiO_xH_y$) or other materials.

FIG. 2C show a raised source/drain as produced by the first method, growing an in-situ doped raised source and drain followed by annealing. Here, the raised source 120 and raised drain 120 are formed by epitaxy. Then the raised source and drain 120 are annealed which drives some of the dopants from the raised source and drain 120 into the substrate 100, or more specifically into a portion of the SOI layer 112, to form source/drain extensions 125. The junction 129 of the source/drain extensions 125 and the SOI layer 112 is represented by the line separating the doped extension 125 and SOI layer 112. A junction 129 is where the low doping (or no doping) of the SOI layer 112 meets the higher doping (or different doping species) of the source/drain extensions 125.

Note that if the second method is used, in one embodiment, the ion implantation process followed by annealing method, then (1) there are no raised source/drains 120 and (2) source and drains take the place of the source and drain extensions 125. In that case, the junction 129 is where the no/low doping of the SOI layer 112 meets the higher doping of the source and drains. Alternatively, the ion implantation process can be performed either before or after the raised source/drain epitaxy process.

In this document, the source/drain extensions 125 of a raised source/drain process and the source/drains of an ion implantation process will both generically be referred to as "doped SOI-source-drain".

The next paragraphs will further discuss the junctions 129 in terms of (1) trajectory of the junction, (2) position of the junction, (3) abruptness of the junction and (4) width of the junction.

Figure 2D:
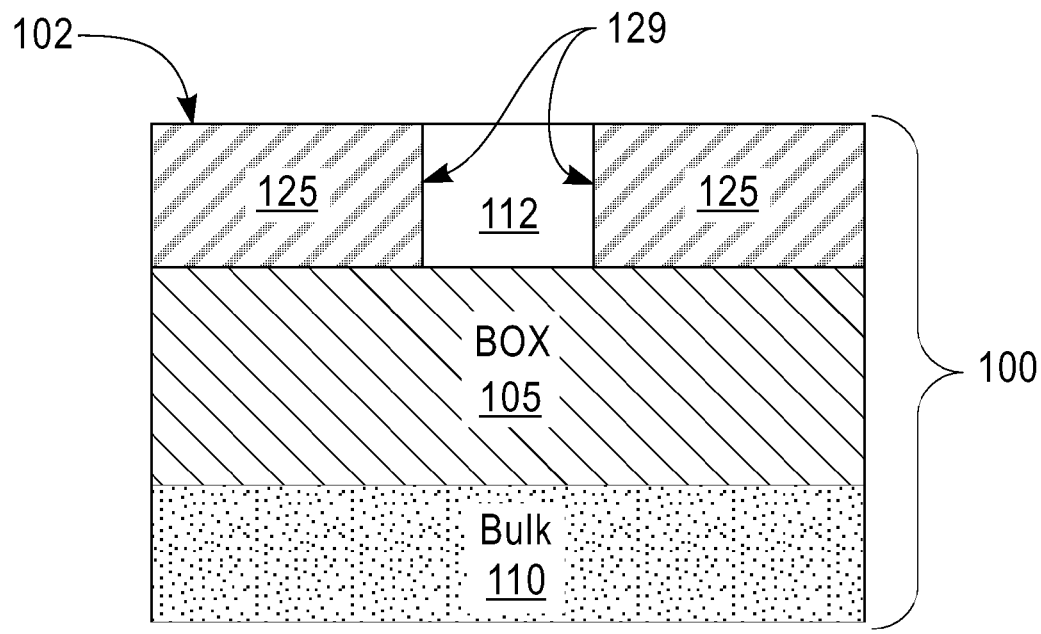
FIG. 2D illustrates a rectangular junction profile formed after making source/drain extension according to an embodiment of the invention.
Figure 2E:
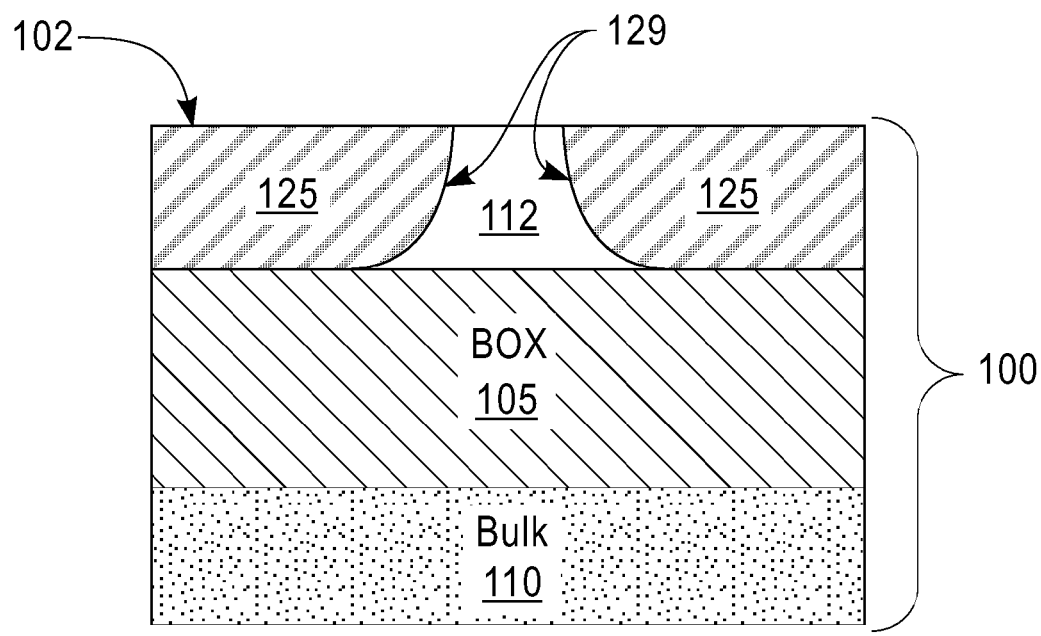
FIG. 2E illustrates a sloping junction profile formed after making source/drain extension according to an embodiment of the invention.
Figure 2F:
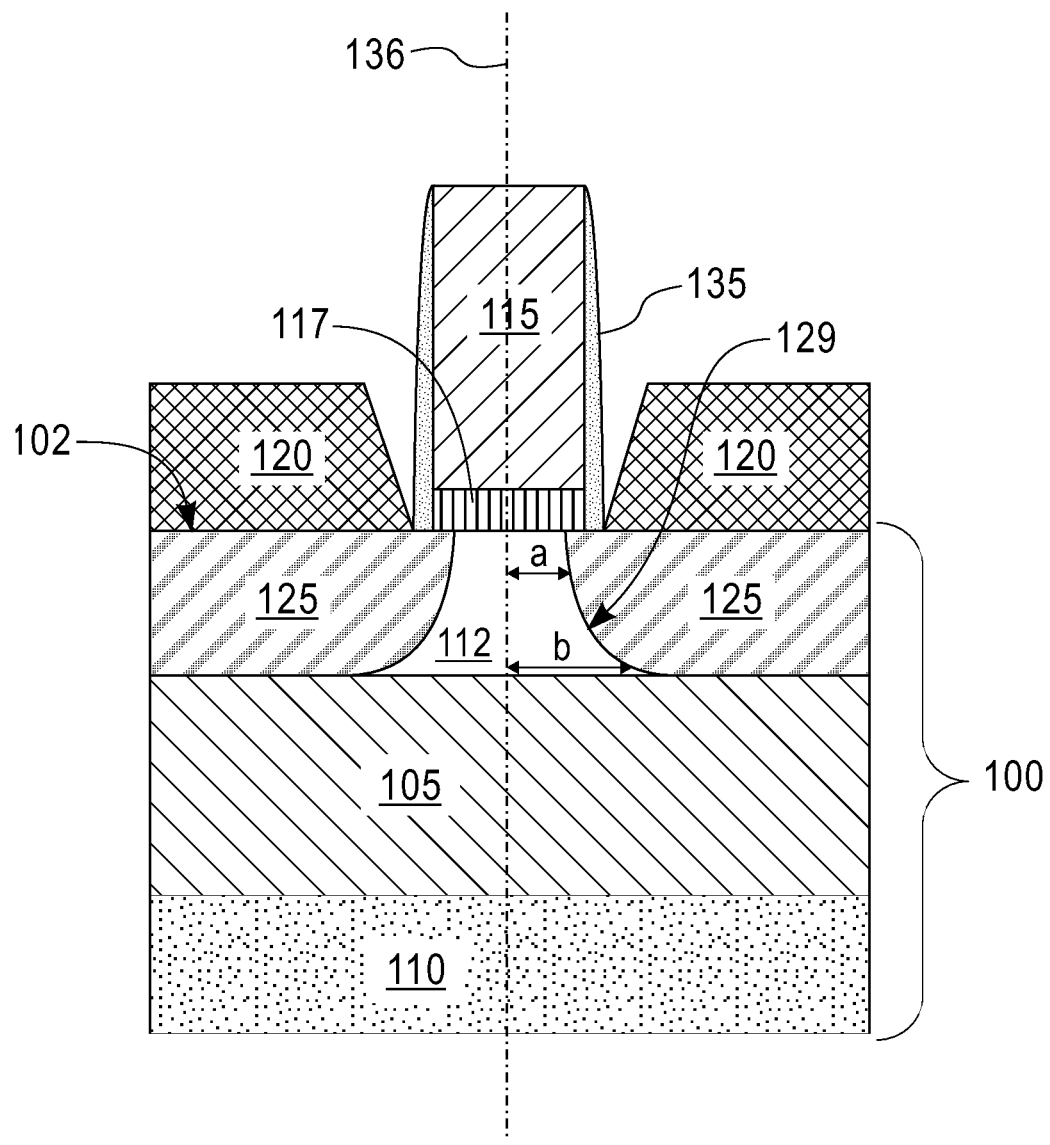
FIG. 2F illustrates junction shape and position relative to a vertical centerline drawn through the dummy gate according to an embodiment of the invention.

The junctions 129 can have different trajectories which in turn results in different doped SOI-source-drain shapes. For example, if the junction is largely vertical, the resulting doped SOI-source-drain 125 shape is rectangular, see FIG. 2D (note the raised source/drains and dummy gate features are removed for clarity). If the junction is sloped, the resulting doped SOI-source-drain 125 shape is trapezoidal, see FIG. 2E (note the raised source/drains and dummy gate features are removed for clarity). FIG. 2F shows a preferred embodiment in which the junction is sloped such that at the top 102 of the SOI layer 112, the junction is closer to a vertical line 136 drawn from the center of the dummy gate (See 'a' in FIG. 2F); and as the junction 129 moves deeper into the SOI layer 112, the junction is further from a vertical line 136 drawn from the center of the dummy (See 'b' in FIG. 2F). Thus in a preferred embodiment, the distance of the top of the junction to a gate center line 136 is less than the distance of the bottom of the junction to the gate center line 136; meaning with reference to FIG. 2F, a<b. The depth and trajectory of a junction is determined by factors including SOI layer 112 thickness, dopant species, anneal time and temperature, and, if ion implantation was used, implantation energy and angle; and if raised source drains were used, the height of the raised source drain, as well as other factors.

Figure 2G:
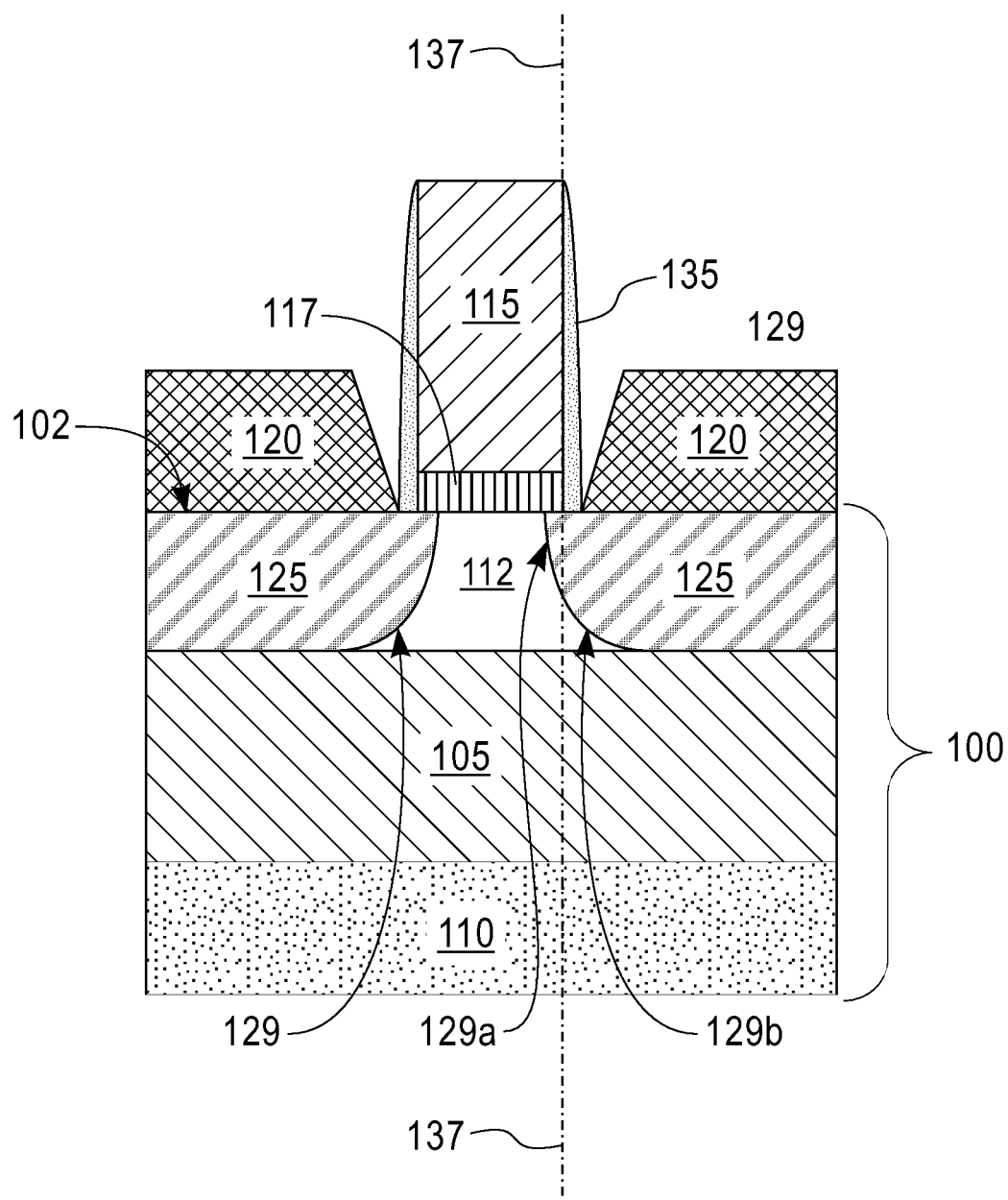
FIG. 2G illustrates junction position relative to a vertical line drawn along the sidewall of the dummy gate according to an embodiment of the invention.

The junction 129 position may vary relative to a vertical line 137 drawn from a side wall of the dummy gate. In a preferred embodiment shown in FIG. 2G, the junction 129 is sloped such that a top portion 129a of the junction (and a portion of doped SOI-source/drain 125) is under the dummy gate 115 and is inside the vertical line 137 extending from the dummy gate sidewall, while a bottom portion 129b of the junction (and a portion of the doped SOI-source/drain 125) is not under the dummy gate and extends outside the gate area. It should be noted that the exact location of the junction with respect to the dummy gate can vary. For example, the top of the junction may be even with (i.e. aligned with) the optional off-set spacer 135 or otherwise may not be directly under the dummy gate 115. What is important, is that during step 60 (to be discussed later), a portion of the junction is etched when the substrate is etched to form a recess. The position of a junction 129 relative to a sidewall 137 of the dummy gate 115 is determined by factors such as dummy gate 115 width, the existence and width of off-set spacers 135, the depth and the trajectory factors discusses at the end of the last paragraph, and in raised source/drain 120 applications, the shape of the raised source/drain.

Figure 2H:
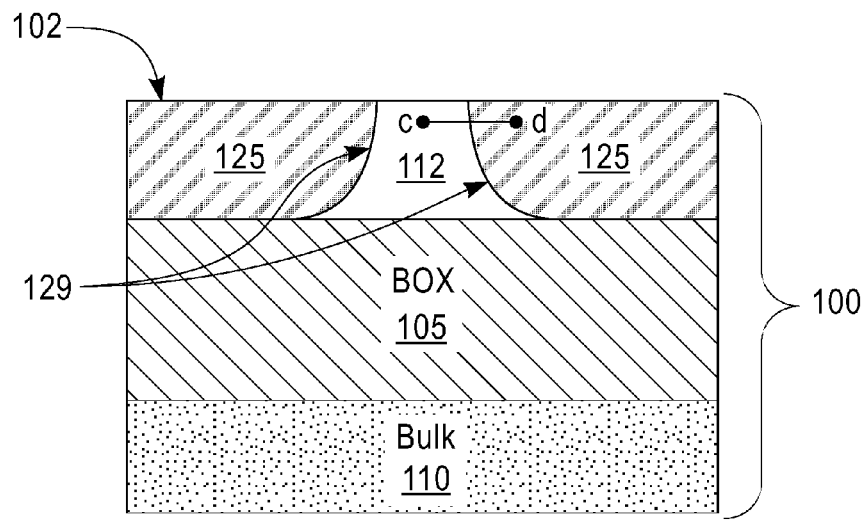
FIG. 2H illustrates a MOSFET with dopant gradient measured between points c and d according to an embodiment of the invention.
Figure 2I:
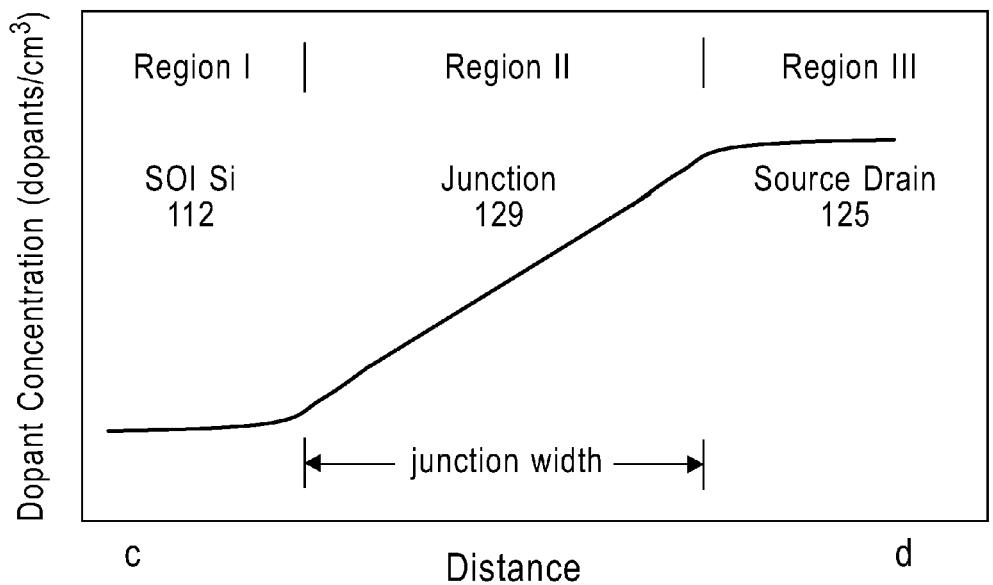
FIG. 2I illustrates a dopant gradient profile according to an embodiment of the invention.

The abruptness of a junction is defined by dopant gradients. Generally speaking, a dopant gradient is the change of doping concentration over a given distance (i.e. the slope of a graph of doping concentration versus distance). Referring to FIG. 2I, the change in doping concentration over a given distance 'c-d' of FIG. 2H is illustrated. The distance 'c-d' starts in the SOI layer 112 at point c, traverses the junction 129 and ends in the source/drain extension 125 at point d. FIG. 2I, is a plot of dopant concentration (dopants/$cm^3$) on the y-axis over the distance 'c-d' on the x-axis. The plot has three distinct regions. At a first region (I) beginning at point 'c', the dopant concentration is relatively constant. Moving toward the junction 129 a second region (II) is reached where the concentration begins to increase such that a slope is created in the plot. Moving toward point d, a third region (III), is reached where a nominal doping level is achieved within the source/drain extensions 125. The slope of the concentration versus distance in region II defines the abruptness of the junction. The width of the slope defines the junction width. A steep slope and small width indicates a sharp or abrupt junction. A less steep slope (shallow slope) and larger width indicate a non-abrupt (diffuse) junction. Typical slopes for an abrupt junction are in the range of 0.5 nm per decade (dopant concentration) to 3 nm per decade (dopant concentration) or any other range in between whether a pFET or an nFET. Typical sharp junction widths are 5 nm to 10 nm or any other range in between. Slopes for diffuse junction are in the range 3 nm per decade (dopant concentration) to 10 nm per decade (dopant concentration) or any other range in between for whether it is a pFET or an nFET. Typical junction widths are 3 to 20 nm for diffuse junctions or any other range in between. FIG. 2I illustrates and shallow slope with wide junction, thus a diffuse junction is formed. Junction features are summarized in the table below.

TABLE 1

Exemplary Junction Features

|  | Diffuse Junction | Sharp Junction |
|---|---|---|
| Doping gradient (slope) | 3-10 nm per decade (dopant concentration) | 0.5-3 nm per decade (dopant concentration) |
| Junction width | 10-20 nm | 5-10 nm |

Thus at the end of the third process step 30 embodied in FIG. 2C, there is a dummy gate 115 above an ETSOI substrate 100 with raised source/drains 120 and source/drain extensions 125 which make a non-abrupt (diffuse) junction 129 with the SOI layer 112. A dummy gate dielectric 117 can be between the dummy gate 115 and ETSOI substrate 100. It should be noted that the embodiment describe above pertains to a MOSFET made by the raised source method. If an embodiment which does not use raised source drains is used, then source/drains take the place of the source/drain extensions 125.

Forming an Insulator Layer

Figure 2J:
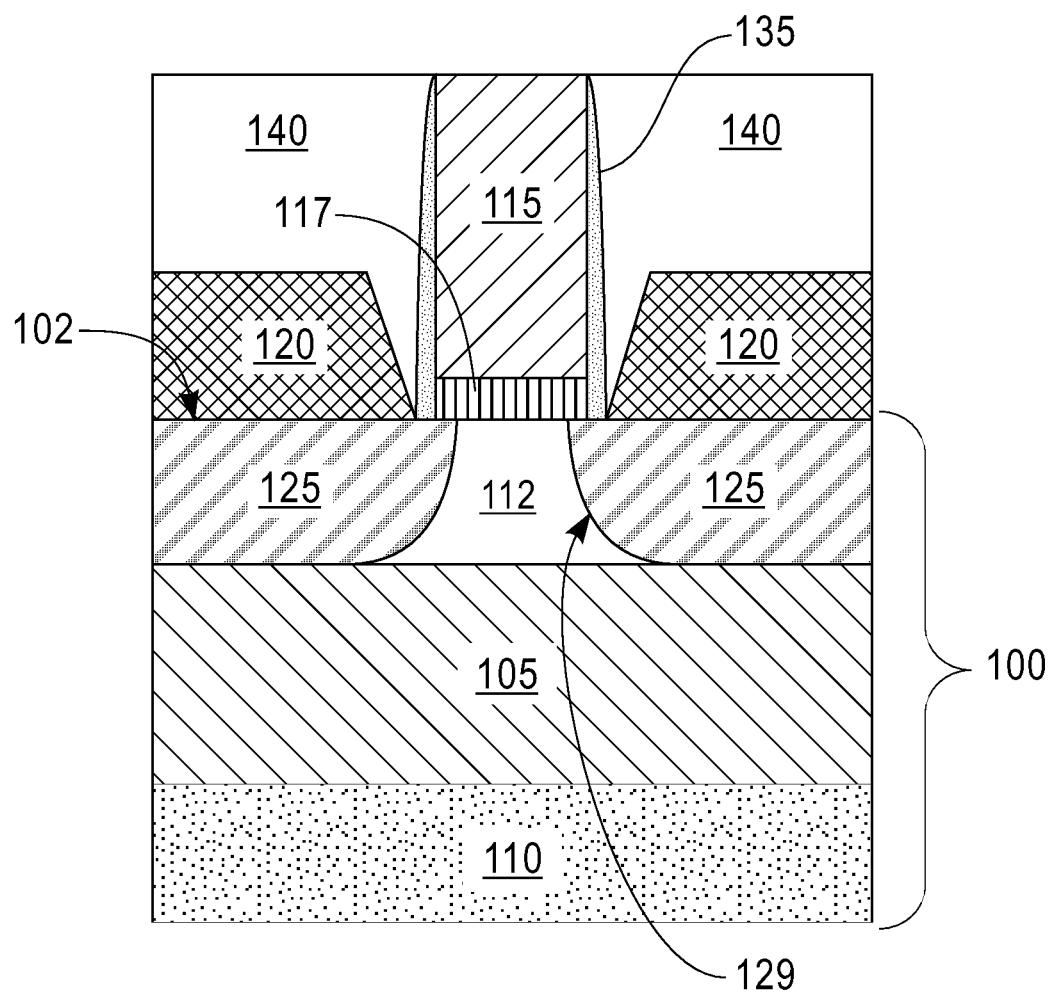
FIG. 2J is a fourth step of the method illustrating the MOSFET with insulator layer planarized so as to be co-planar with the dummy gate according to an embodiment of the invention.

Step 40 of making a MOSFET with sharp junctions involves forming an insulating layer 140. Initially, the insulator layer 140 is deposited so as to cover the dummy gate 115. The insulator 140 is then planarized by stopping on the dummy gate 115 (See FIG. 2J). Suitable insulators include, but are not limited to, silicon dioxide ($SiO_2$), silicon oxides (SiOH), doped silicon glass, silicon carbon oxide (SiCO), SiCOH, and silicon carbide (SiC).

Removing the Dummy Gate

Figure 2K:
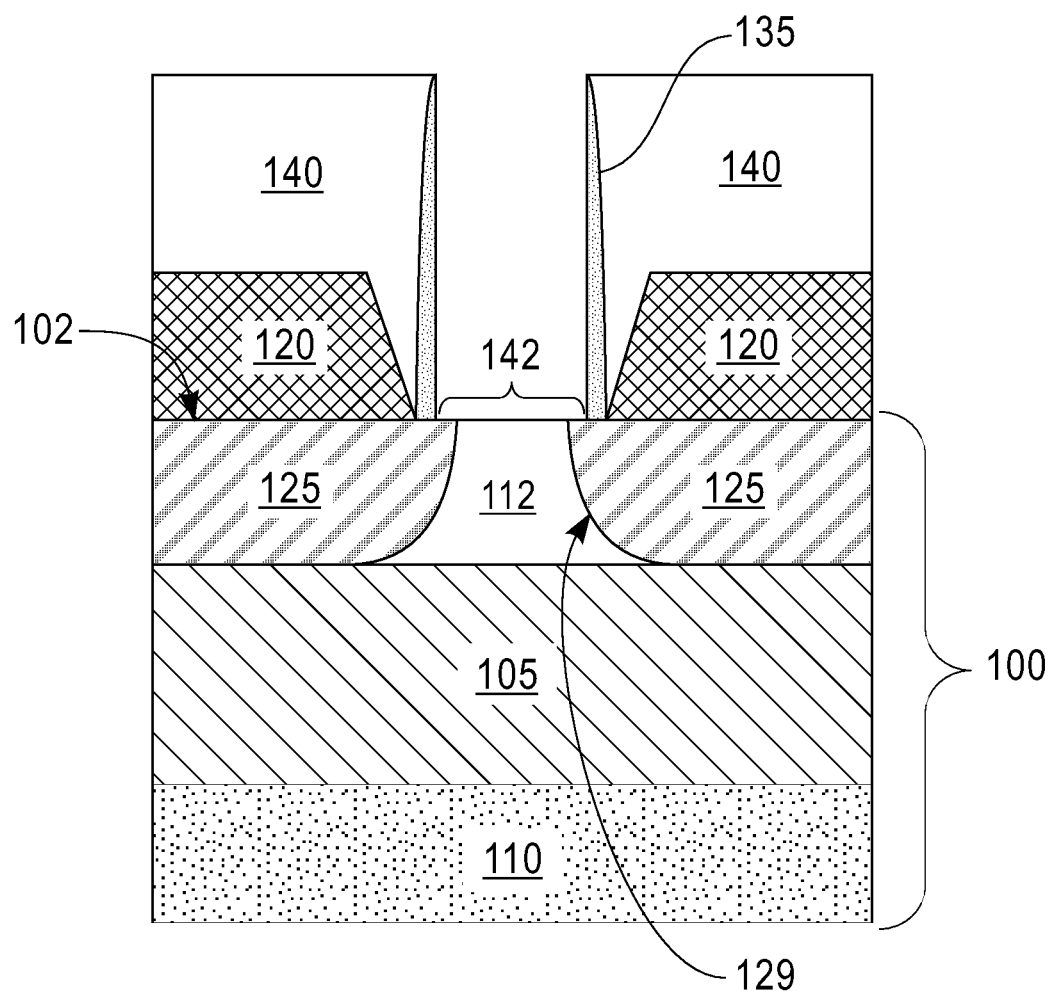
FIG. 2K is a fifth step of the method illustrating the MOSFET after dummy gate removal according to an embodiment of the invention.

Referring to FIG. 2K, step 50 of making a MOSFET with sharp junctions involves removing the dummy gate 115 to reveal an exposed portion 142 of the substrate. The exposed portion 142 can include at least a portion of one of the following: (1) SOI layer 112, (2) junction 129 and (3) source and drain extensions 125. In FIG. 2K, an embodiment is shown in which the exposed portion 142 includes (1) SOI layer 112, (2) junction 129, and (3) a portion of the source/drain extension 125.

Typically, the dummy gate is removed using a selective etch. In a preferred embodiment, the dummy gate 115 is silicon nitride ($Si_xN_yH_z$) while insulator 140 and/or optional off-set spacer 135 is silicon oxide ($Si_xO_yH_z$); the etch then selectively removes the nitride while minimally removing the oxide.

Figure 2L:
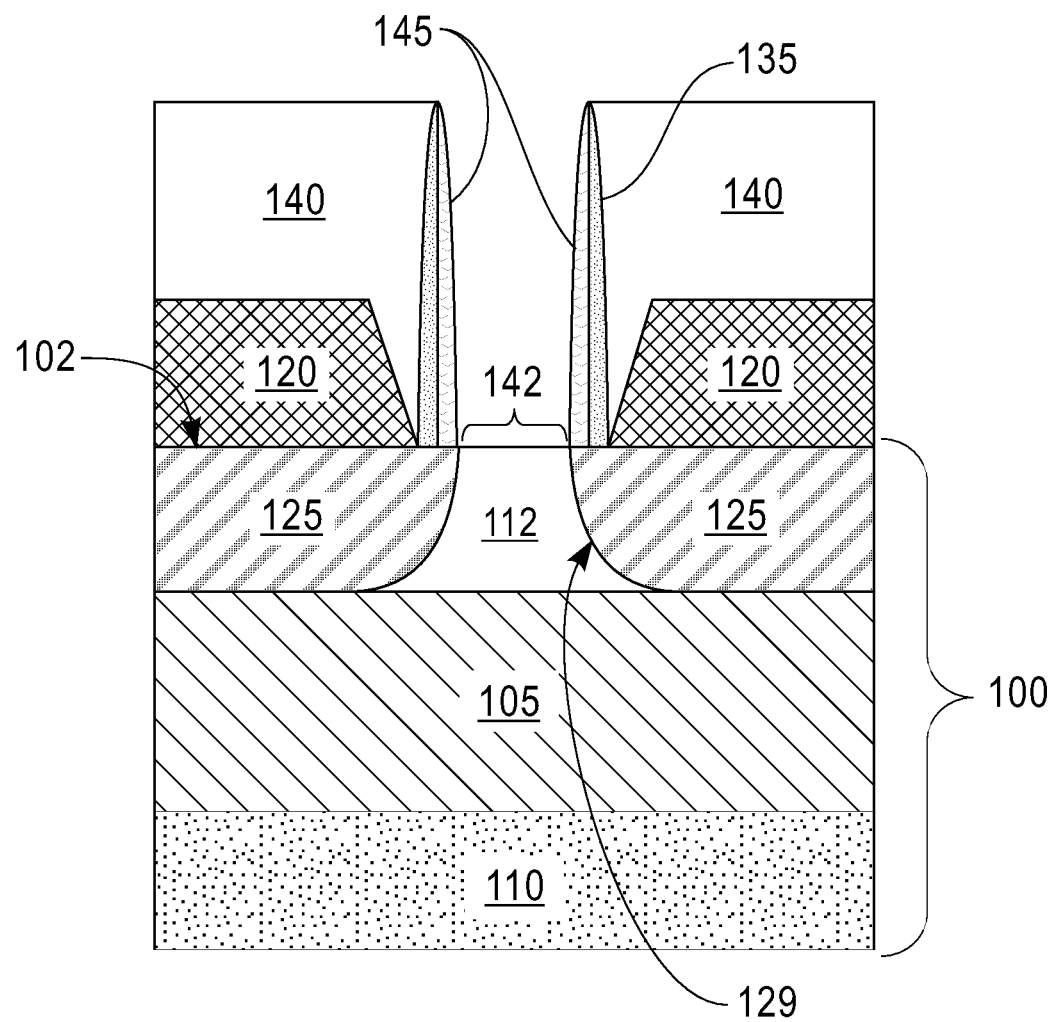
FIG. 2L is a fifth step of the method illustrating the MOSFET after dummy gate removal and formation of optional inner spacers according to an embodiment of the invention.

After dummy gate removal, an optional inner spacer 145 may be deposited (See FIG. 2L). The inner spacer can be made of silicon nitride ($Si_xN_yH_z$). Typically, the inner spacers are formed so that they are wide enough to cover the source/drain extension 125 that may have been exposed during the dummy gate removal. Ideally, the inner spacer aligns with the junction 129 as shown in FIG. 2L. As a result, when an inner spacer is used, the exposed portion 142 of the substrate includes an exposed SOI layer 112. The table below summarizes what elements constituted an exposed portion 142 depending upon whether or not an inner spacer 145 is used.

TABLE 2

Exposed Portion 142 Content and Inner Spacer 145 Use

| | | Exposed Portion 142 Includes . . . | |
|---|---|---|---|
| When . . . | SOI layer 112 | Junction 129 | Source/drain Extension 125 |
| Inner Spacer 145 Used | Yes | Inner spacer roughly aligns with junction 129 | No |
| No Inner Spacer 145 Used | Yes | Yes | Optional |

Forming a Recess

Figure 2M:
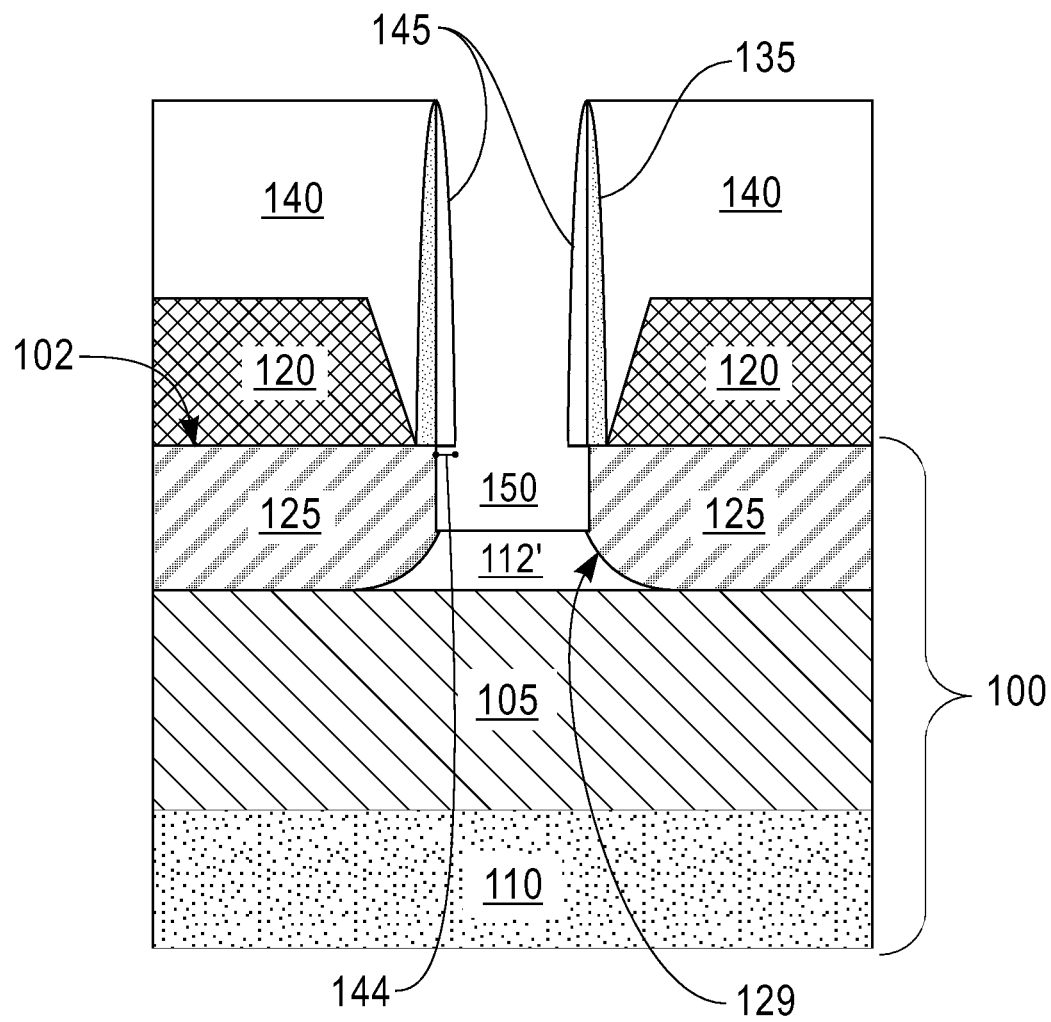
FIG. 2M is a sixth step of the method illustrating the MOSFET with a recess formed by an ex-situ anisotropic etch process according to an embodiment of the invention.

Referring to FIG. 2M, step 60 is etching the exposed portion 142 to form a recess 150 while leaving a remainder 112' of SOI layer. Generally speaking there are two ways to form the recess, an ex-situ process in which the recess is made separately from a subsequent channel film deposition (step 70), or an in-situ process in which the recess is formed and the channel is deposited in one tool. The ex-situ process will be discussed first.

In the ex-situ process, the recess may be formed in one of two ways: an isotropic way or an anisotropic way. In the case of an isotropic way, either a gas phase etch or a wet etch may be used. HCl is a common gas phase etchant and aqueous etchant containing ammonia is a common wet etchant, however other chemistries are also acceptable. A wet etch or gas phase etch typically results in an isotropic etch meaning that the etch rate is the same in all directions. Thus, with an isotropic etch, a portion of the SOI layer 112 will be etched vertically and also laterally to create an undercut 144 portion of the recess 150. Because an undercut 144 is possible with isotropic recess formation, inner spacers 145 are preferably used with isotropic etching conditions. FIG. 2M shows a recess 150 formed by an isotropic etch process which results in an undercut 144 portion of the recess under the inner spacer 145. Note the undercut 144 is on both sides of the recess 150, but is only labeled on a single side for ease of viewing.

Figure 2N:
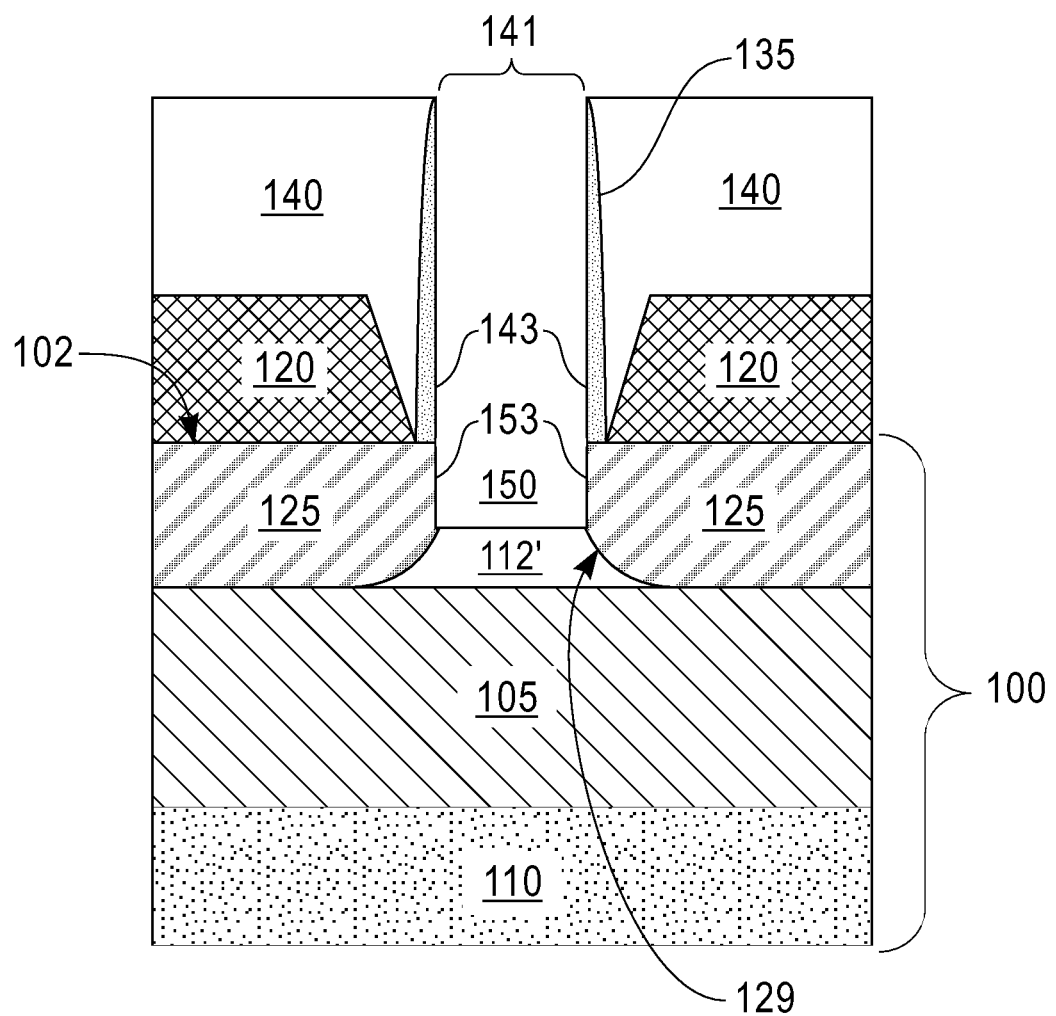
FIG. 2N is a sixth step of the method illustrating the MOSFET with a recess formed by an ex-situ isotropic etch process according to an embodiment of the invention.

The second ex-situ recess forming process is a dry etch process, preferably reactive ion etching (RIE). Generally speaking, RIE processes of the current invention are anisotropic, meaning they etch largely in one direction, vertically, with minimal lateral etching. Thus, with an anisotropic etch, the SOI layer 112 will be etched vertically to align with an opening 141 left by the dummy gate removal. When an anisotropic etch process is used, it is preferred not to use inner spacers 145. FIG. 2N shows a recess 150 formed by anisotropic etch process which results in the sidewalls 153 of the recess 150 aligning with the outer edges 143 of the opening 141.

Turning to the in-situ process of recess formation, the recess process is integrated with the subsequent deposition process in a single epitaxy tool. The deposition process forms an epitaxial layer in the recess 150 resulting in a channel 155. The integrated process starts in the epitaxy tool by flowing HCl so as to precisely etch the SOI layer 112 to form a recess 150. Next, there is optional hydrogen pre-bake. If the pre-bake is used, depending on the pre-bake process condition, an undercut can be formed. Finally, the epitaxial deposition takes place to create the channel 155. Generally speaking, when an in-situ recess etch and channel deposition process is used, inner spacers 145 can be omitted (See FIG. 2O) unless the there is an undercut.

Figure 2O:
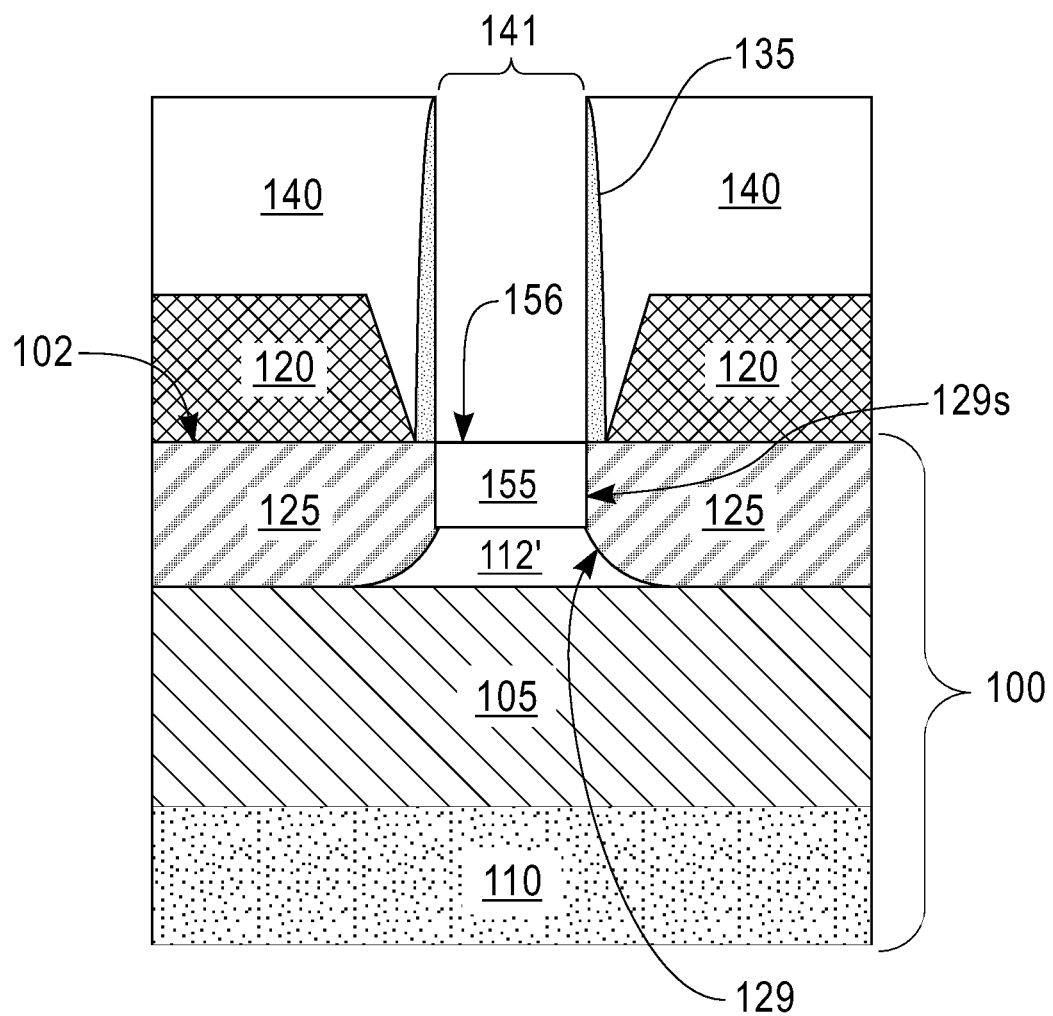
FIG. 2O is a sixth step of the method illustrating the MOSFET with a recess formed by an in-situ etch process according to an embodiment of the invention.

An important feature of the recess process, regardless of recessing method used (isotropic or anisotropic, in-situ or ex-situ), is that the recessing removes a portion of the junction 129. The portion of the junction 129 removed can extend laterally to encompass the entire dopant gradient or just a portion of the dopant gradient at that recess depth. In addition, a portion of source/drain extension 125 of nominal doping (nominal doping meaning where the gradient has stopped and a relative steady state doping level exists) may also be removed during the recess process, but is not required. Referring to FIGS. 2M, 2N and 2O, the recess process has removed a portion of the SOI layer 112 to leave a remaining portion 112' of the SOI layer. The recess process has also removed the junctions 129 from the top of the SOI layer, but below, leaving the diffuse junction 129 between the source/drain extension 125 and remaining SOI layer 112'. In addition, the recess process has removed a top corner of each of the source/drain extensions 125.

The amount of remainder 112' SOI layer can vary. As stated above in discussion of substrates, in a preferred embodiment, the SOI layer 112 starting thickness is from 2 nm to 20 nm thick or any other range in between. After recessing the SOI layer 112, the remaining SOI layer 112' can be as small as 1 nm. The exact thickness of remaining SOI layer 112' is not critical; however, what is critical is that there is sufficient remaining SOI layer 112' so as to be able to grow an epitaxial layer on top as required in the seventh step 70.

Forming a Channel and Abrupt Junction

Step 70 is forming epitaxial layer ("epi") containing silicon in the recess 150 to make a channel 155. As stated above, the epitaxial layer which includes channel 155 is grown on top of the remaining SOI layer 112'. The epitaxial layer including channel 155 may be grown so that it completely fills the recess (full-epi method shown in FIG. 2O) or it may be grown so that the epi channel partially fills the recess (partial-epi method shown in FIG. 2P). Each fill method is discussed below.

In the full-epi-grow-back method, the epitaxial layer including the channel 155 is grown such that the top surface 156 of the channel film 155 is approximately co-planar with the substrate top surface 102. Note, that in FIG. 2J, the substrate top surface 102 is equivalent to the interface of the raised source/drain 120 and source/drain extensions 125.

In an embodiment of a full-epi-grow-back method on an ETSOI substrate with original SOI layer 112 thickness of 2 nm to 20 nm, the channel thickness may be from 1 nm to 19 nm or any other range in between and the remaining SOI layer 112' thickness may be as small as 1 nm. In a preferred embodiment of a full-epi-grow-back process, the original SOI layer 112 thickness is 6 nm to 8 nm, the remaining SOI layer 112' thickness after recess etch is 1 nm to 2 nm, and the epitaxial layer forming the channel film 155 fills the recess (i.e. the channel thickness is 4 nm to 7 nm thick depending upon the thicknesses of the original SOI layer and remaining 112' SOI layer).

In the partial-epi-grow-back method, the epitaxial layer including the channel film 155 is grown such that the top surface 156 of the channel film 155 is below the substrate top surface 102, thereby creating a step between the channel top surface 156 and the substrate top surface 102. The height of the step is shown as 158 in FIG. 2P. Note, that in FIG. 2P, the top surface of the substrate 102 is equivalent to the interface of the raised source/drain 120 and source/drain extensions 125.

In an embodiment of the partial-epi-grow-back method on an ETSOI substrate with original SOI layer 112 thickness of 2 nm to 20 nm or any other range in between, the channel thickness may be from 1 nm to 18 nm or any other range in between, and the remaining SOI layer 112' thickness may be as small as 1 nm. In a preferred embodiment of a partial-epi-grow-back method, the original SOI layer 112 thickness is 10 nm, the remaining SOI layer 112' thickness after recess etch is 2 nm, and the epitaxial layer forming the channel 155 is 4 nm thick such that the step height 158 is 4 nm.

Turning to the channel film formation process itself, recall that the recess 150 could be formed by two processes: ex-situ and in-situ. The in-situ process combined the recess etching and channel formation processes in a single tool. Thus, the channel film 155 formation process for the in-situ process was previously discussed and will not be repeated here. However, the channel formation process used with the ex-situ process was not previously discussed and is now described. The channel formation process following an ex-situ recess etch begins with a pre-clean. The pre-clean may be a sputter process which is largely anisotropic, thus there is no undercutting. Or the pre-clean process may be wet chemical etch, such as ammonia, which is isotropic, thus creating an undercut 144. Then the substrate is placed in an epitaxial tool where it receives an in-situ low temperature pre-clean (to avoid agglomeration), followed by channel film growth. Details of the in-situ low temperature pre-clean may be found in U.S. application Ser. No. 12/766,859 filed on Apr. 24, 2010, the entire contents of which is incorporated herein by reference.

Channel films 155 include undoped silicon (Si), silicon germanium (SiGe), silicon germanium carbide (SiGeC), silicon carbide (SiC) or III-V materials. In a preferred embodiment, the channel film 155 of a pFET is SiGe and the channel film 155 of an nFET is Si or SiC.

Figure 2P:
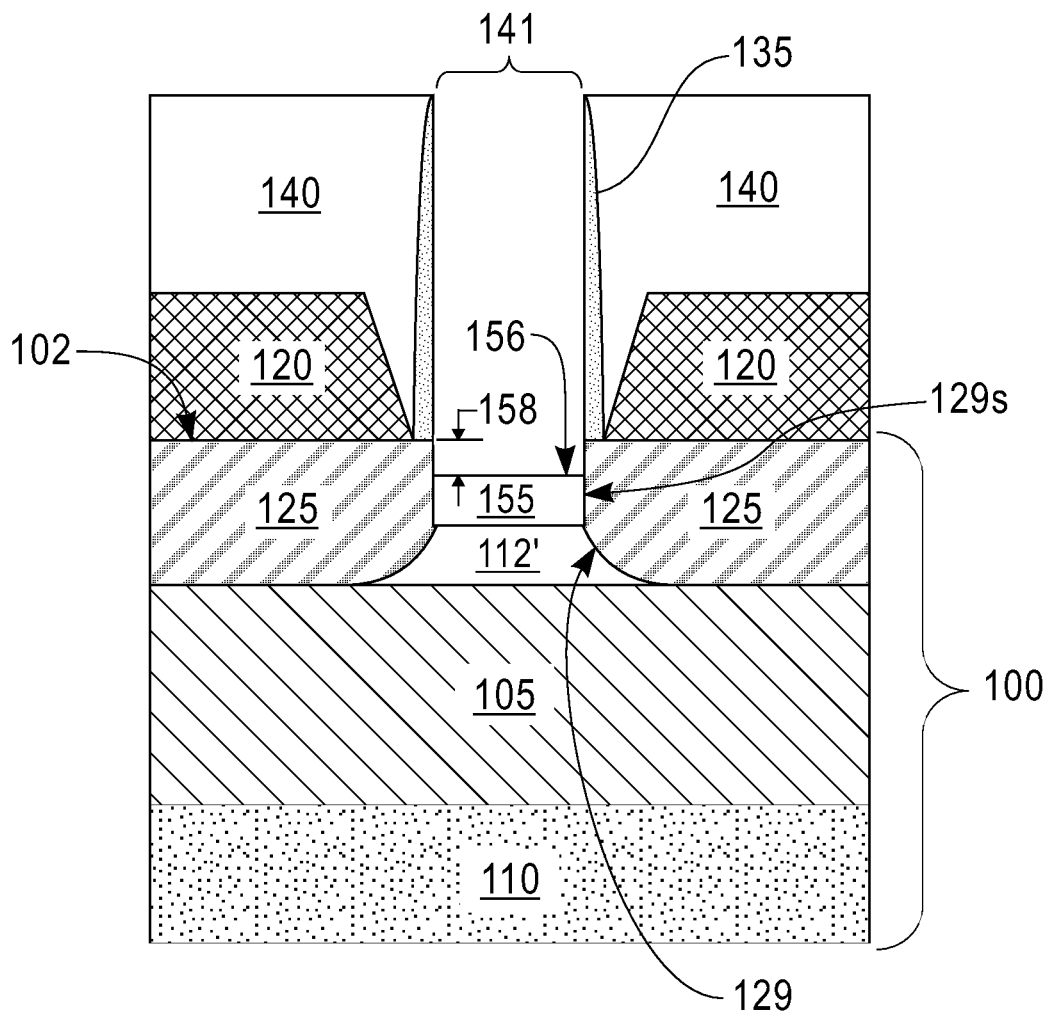
FIG. 2P is a sixth step of the method illustrating the MOSFET with a channel formed by a partial fill process according to an embodiment of the invention.
Figure 2Q:
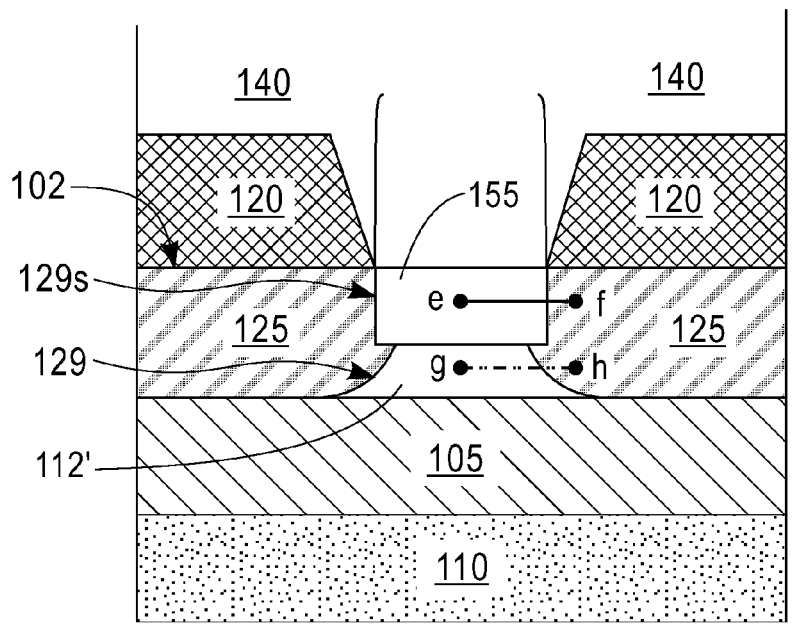
FIG. 2Q is a sixth step of the method illustrating the MOSFET with two junction regions according to an embodiment of the invention.
Figure 2R:
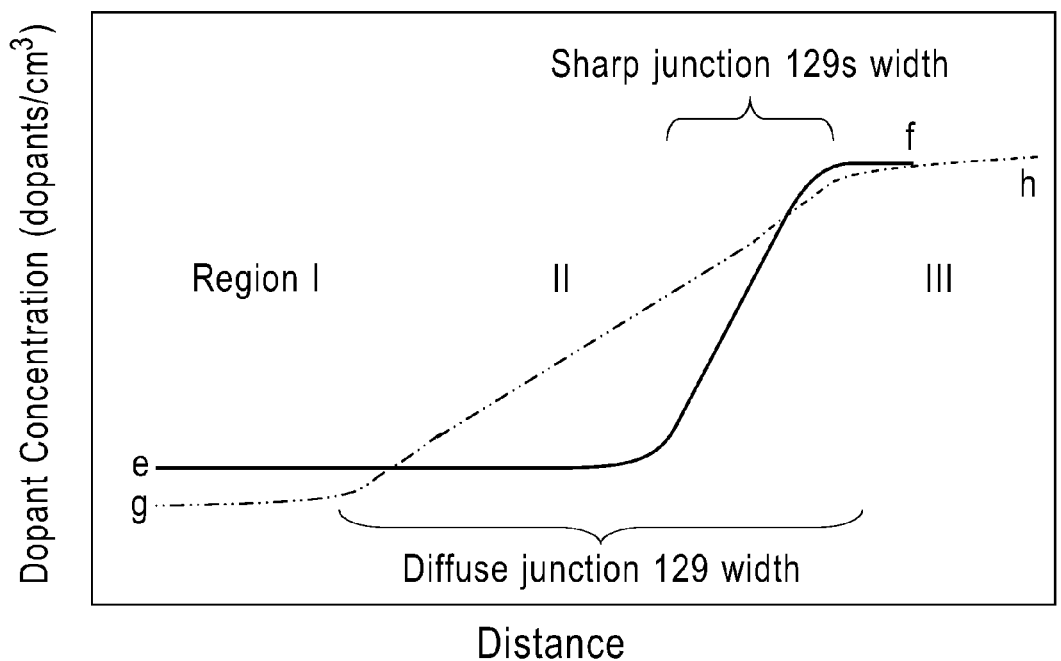
FIG. 2R is a dopant concentration versus distance plot illustrating the MOSFET with two junction regions according to an embodiment of the invention.

Referring to FIGS. 2Q and 2R, the changes in doping concentration over a given distance 'e-f' and a given distance 'g-h' are illustrated. The distance 'e-f' starts in channel film 155 at point e, traverses the junction 129s and ends in the source/drain extension 125 at point f. The solid line in FIG. 2R, is a plot of dopant concentration (dopants/cm$^3$) on the y-axis over the distance 'e-f' on the x-axis. The plot has three distinct regions. At a first region (I) beginning at point 'e', the dopant concentration is relatively constant. Moving toward the junction 129s a second region (II) is reached where the concentration sharply increases. Moving toward point f, a third region (III), is reached where a nominal doping level is achieved within the source/drain extensions 125. The sharp slope of the concentration versus distance in region II of a line going from 'e-f' illustrates an abrupt or sharp junction 129s.

In contrast, a trace of concentration change along the 'g-h' lines shows a more gradual slope. The distance 'g-h' starts in the remaining SOI layer 112' at point g, traverses the junction 129 and ends in the source/drain extension 125 at point h. The dotted line in FIG. 2R, is a plot of dopant concentration (dopants/cm$^3$) on the y-axis over the distance 'g-h' on the x-axis. The plot has three distinct regions. At a first region (I) beginning at point 'g', the dopant concentration is relatively constant. Moving toward the junction 129 a second region (II) is reached where the concentration gradually increases. Moving toward point h, a third region (III), is reached where a nominal doping level is achieved within the source/drain extensions 125. The gradual slope of the concentration versus distance in region II of a line going from 'g-h' illustrates a non-abrupt or diffuse junction 129. Typical dopant gradients (slopes) and junction widths for nFETs and pFETs for sharp junctions 129s and diffuse junctions 129 were previously listed in Table 1.

Thus at the end of the seventh process step 70 embodied in FIG. 2O or 2P, there is an ETSOI substrate 100 with raised source/drains 120, insulator 140, optional off-set spacers 135, source/drain extensions 125, remaining SOI layer 112' and a channel film 155. The substrate has two junction regions. A first junction 129s region, where the channel film 155 and source/drain extensions 125 meet, is abrupt. A second junction 129 region, where the remaining SOI layer 112' and source/drain extensions 125 meet, is diffuse. It should be noted that the embodiment describe above pertains to a MOSFET made by the raised source method. If an ion implantation method is used without source drains, then there are no raised source/drains and the source drain extensions are replaced by source and drains.

Depositing High-k Material and Gate Stack

Figure 2S:
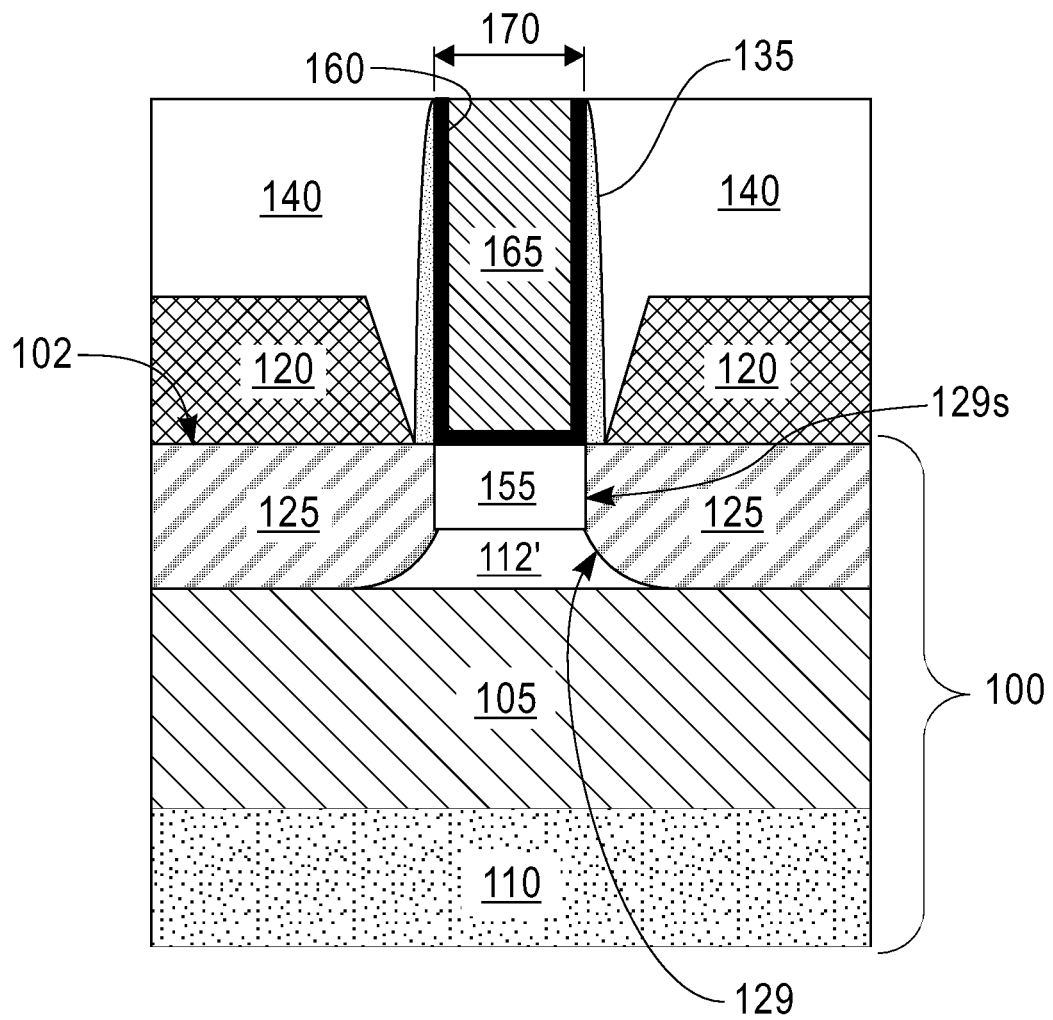
FIG. 2S is an eighth step of the method illustrating the a MOSFET with high dielectric constant materials and metal gate.

Referring to FIG. 2S, step 80 is depositing a high dielectric constant material 160 (herein referred to has "high-k") and forming a metal gate stack 165. Examples of high-k materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k may further include dopants such as lanthanum, aluminum. High-k material can be deposited by any suitable process, including but not limited to, atomic layer deposition (ALD), molecular layer deposition (MLD), chemical vapor deposition (CVD), plasma enhanced chemical vapor deposition (PECVD), high density plasma chemical vapor deposition (HDPCVD), rapid thermal chemical vapor deposition (RTCVD), in-situ radical assisted deposition, ultrahigh vacuum chemical vapor deposition (UH-VCVD), metal organic chemical vapor deposition (MOCVD), molecular beam epitaxy (MBE), physical vapor deposition, sputtering, evaporation, ion beam deposition, electron beam deposition, laser assisted deposition, chemical solution deposition, or any combination of those methods. The high-k thickness may range from 0.5 nm to 3 nm or any other range in between. An interfacial layer such as silicon oxide, silicon nitride, silicon oxynitride (not shown) may be formed on the channel before high-k deposition.

Suitable gate stack 165 materials can include, but are not limited to, doped polycrystalline or amorphous silicon, germanium, silicon germanium, a metal (e.g., tungsten, titanium, tantalum, ruthenium, zirconium, cobalt, copper, aluminum, lead, platinum, tin, silver, gold), a conducting metallic compound material (e.g., tantalum nitride, titanium nitride, tungsten silicide, tungsten nitride, ruthenium oxide, cobalt silicide, nickel silicide), carbon nanotube, conductive carbon, or any suitable combination of these materials. The conductive material can further include dopants that are incorporated during or after deposition. Suitable processes described above for high-k deposition can be used for forming the gate stack 165. The thickness of the gate stack 165 may range from 10 nm to 100 nm or any other range in between.

A gate width 170 is measured from a first outer edge of the high-k material across the gate stack to a second outer edge of the high k material. Preferably a gate width is measured at the bottom of the gate where it meets the channel 155, however, for ease of viewing, gate width 170 is shown at the top in FIG. 2S. Gate widths can be from about 5 nm to about 50 nm or any other range in between, preferably from about 5 nm to about 25 nm.

This concludes the description of the method of making MOSFETs with a recessed channel and abrupt junctions. While the present invention has been described with reference to what are presently considered to be the preferred embodiments, it is to be understood that the invention is not limited to the disclosed embodiments. On the contrary, the invention is intended to cover various modifications and equivalent arrangements included within the spirit and scope of the appended claims. The scope of the following claims is to be accorded the broadcast interpretation so as to encompass all such modifications and equivalent structures and functions.

MOSFET with Recessed Channel and Sharp Junctions

Next, embodiments of the substrates and MOSFETs created by methods previously described are illustrated.

MOSFET Made with Full-Epi-Grow-Back Process

Figure 3:
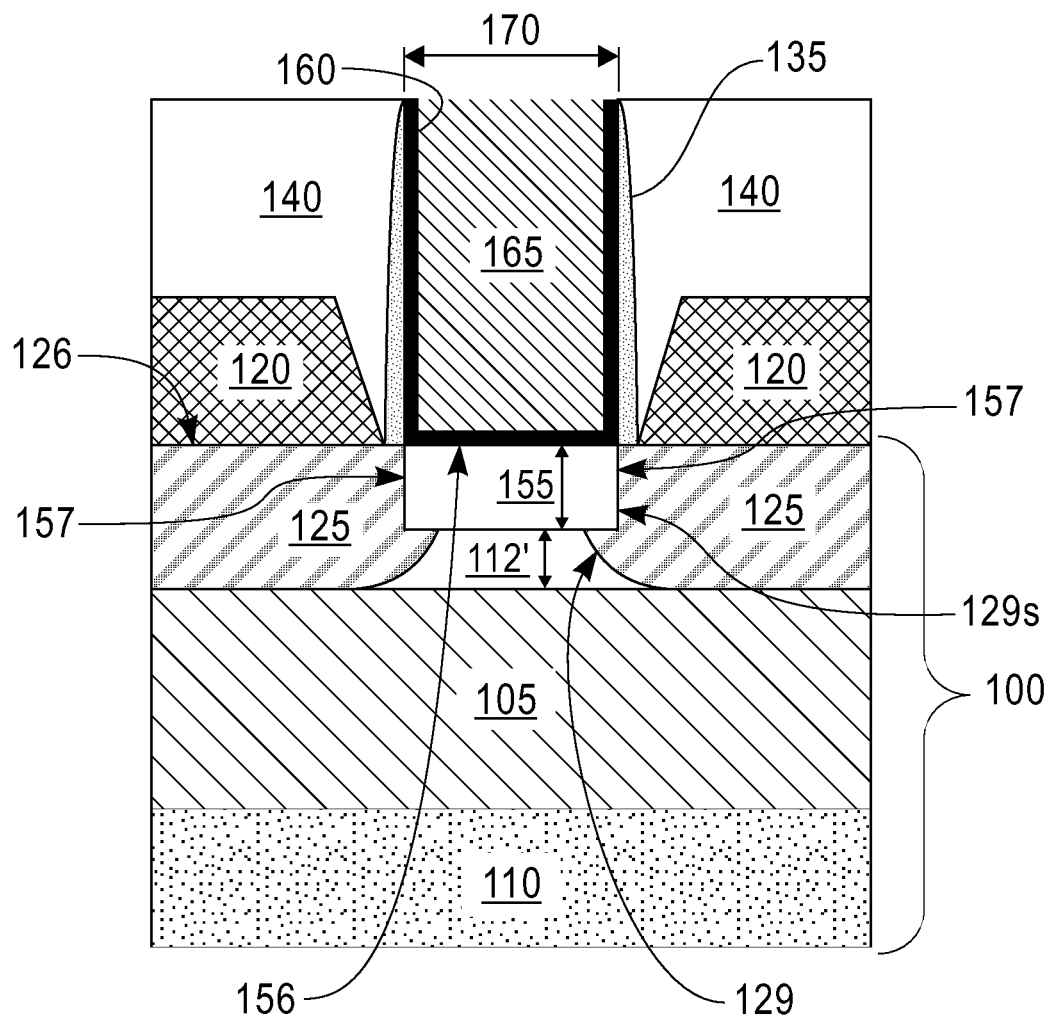
FIG. 3 illustrates a MOSFET with abrupt junctions and made by a full-epi-grow-back embodiment of the invention.

FIG. 3 is a MOSFET 190 with abrupt junctions and made by the full-epi-grow-back method is presented. The SOI substrate 100 has a bulk portion 110, a buried oxide portion (BOX) 105 and a remaining SOI portion 112'. Remaining SOI layer 112' can be silicon, silicon doped with conventional 'n' or 'p' dopants (such as group VA (group 15 IUPAC style) and group IIIA (group 13 in IUPAC style) elements of the periodic table, respectively), silicon germanium (SiGe), silicon germanium carbon (SiGeC), silicon carbon (SiC), III-V semiconductor compounds (for example, InP, GaAs or $In_{1-x}Ga_xAs$) or other variations. In a preferred embodiment, the remaining SOI layer 112' may be p-type (e.g., boron, indium) or n-type (e.g., phosphorus, arsenic) doped silicon with a dopant concentration less than or equal to 1E17 dopants/$cm^3$. The thickness of the remaining SOI layer 112' can be about 1 nm to about 10 nm thick or any other range in between. The lower limit of 1 nm is not an absolute value, but instead the lower limit is the minimum amount of silicon needed on which to grow the channel film 155. The thickness of the remaining SOI layer 112' is indicated by the double headed arrow in 112' of FIG. 3.

With reference to FIG. 3 the channel film 155 may be include undoped silicon (Si), silicon germanium (SiGe), silicon germanium carbide (SiGeC), silicon carbide (SiC) or III-V materials previously mentioned. In a preferred embodiment, the channel film 155 of a pFET is SiGe and the channel film 155 of an nFET is Si or SiC. The channel film 155 thickness can be from about 1 nm to about 20 nm or any other range in between. The channel has a top surface 156, a bottom surface, and two side surfaces 157. The channel top surface 156 is approximately co-planar with the top surface 126 of the doped SOI-source/drain 125. The channel thickness is indicated by the double headed arrow in channel film 155.

The relative thicknesses of the channel film 155 and remaining SOI layer 112' should be noted. For substrates 100 in which the original SOI layer 112 thickness (See FIG. 2A) was less than or equal to 20 nm, the thickness of the channel film 155 is, usually, equal to or greater than the thickness of the remaining SOI layer 112' (See FIG. 3). In a preferred embodiment, the ratio of channel film 155 thickness to remaining SOI layer 112' thickness is greater than 1.5. For substrates 100 in which the original SOI layer 112 thickness (See FIG. 2A) was greater 20 nm, the thickness of the channel film 155 is, usually, equal to or less than the thickness of the remaining SOI layer 112'.

Returning to the MOSFET 190 shown in FIG. 3, above the channel is a high-k dielectric film 160. High-k films and deposition processes were discussed earlier in conjunction with method step 80 and will not be repeated here. The high-k dielectric 160 has outer side surfaces. In FIG. 3, lines extending up from the outer surfaces indicate their position. The distance 170 between the lines (i.e. between the outer surfaces) is the gate width. The gate width is preferably measured at the bottom of the high-k 160 and channel film 155 interface but is shown at the top for ease of viewing. In a preferred embodiment, the outer side surfaces of the high-k material 160 align with side surfaces 157 of the channel 155. Thus, the gate width and channel width (distance between side surfaces 157 of the channel film 155) are approximately equal in a preferred embodiment. In another other embodiment, the channel width may be wider than the gate width 170, such that the outer surfaces of the high-k dielectric are within the side surfaces 157 of the channel. In one embodiment of the channel width is approximately 2 to 5 nm wider per side. Or in other words, the undercut 144 is 2 nm to 5 nm per side. In a further embodiment, the channel width can be narrower than the gate width 170, such that the side surfaces 157 of the channel are within the outer surfaces of the high-k material.

The metal gate 165 is also above the channel film 155 and separated from the channel film 155 by the high-k material 160. The metal gate 165 materials and deposition processes were previously discussed in conjunction with method step 80 and will not be repeated here. The metal gate stack height can be similar to the heights of the dummy gate described in the method step 20.

On either side of the high-k material 160 is an insulator 140. Suitable insulators 140 include, but are not limited to, silicon dioxide ($SiO_2$), silicon oxides (SiOH), doped silicon glass, silicon carbon oxide (SiCO), SiCOH, and silicon carbide (SiC).

Figure 4:
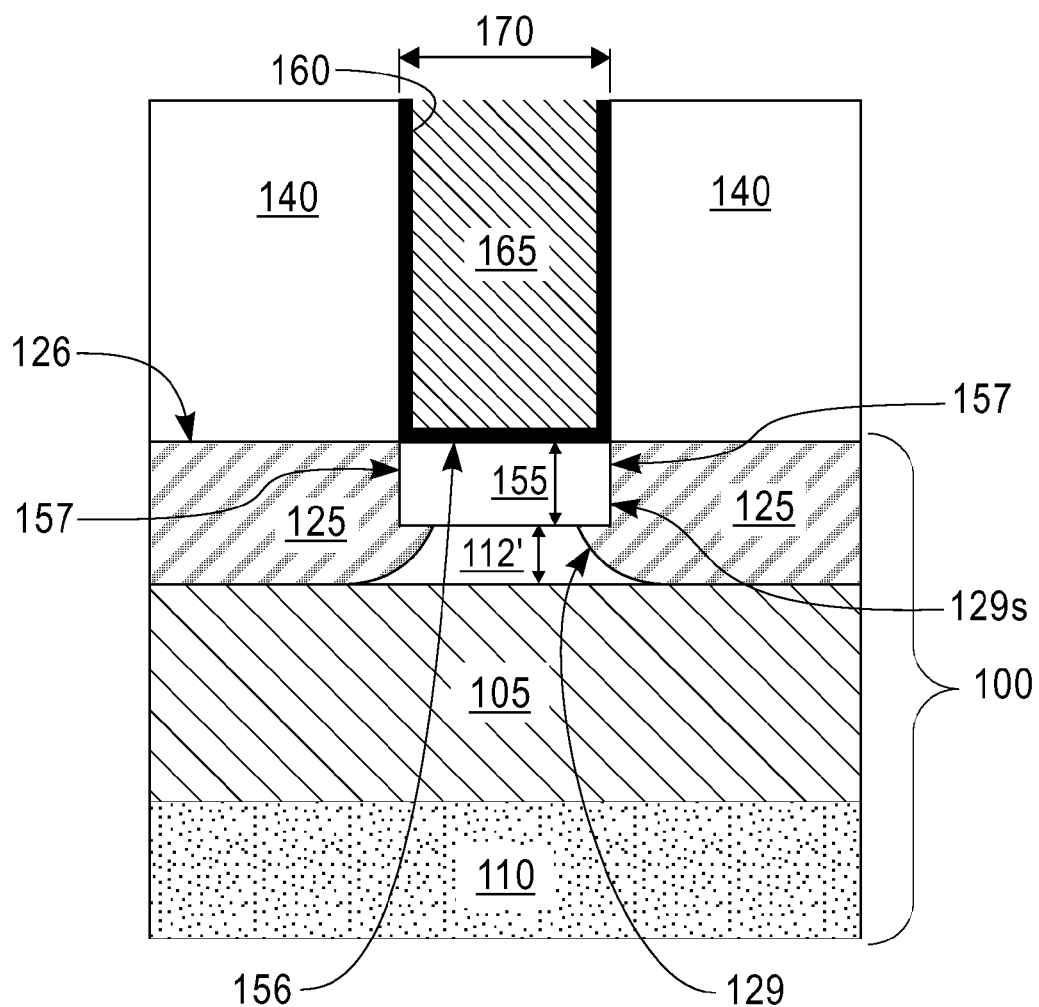
FIG. 4 illustrates a MOSFET without off-set spacers according to an embodiment of the invention.

Optionally, juxtaposed between the insulator 140 and high-k material 160 is an off-set spacer 135. The optional off-set spacers 135 may be made from silicon nitride ($Si_xN_yH_z$) or silicon oxides ($SiO_xH_y$) or other materials. FIG. 3 shows an embodiment of the invention with off-set spacers 135, and FIG. 4 shows an embodiment without off-set spacers 135. Note that the insulator has an opening which is defined by the distance 170 (i.e. the gate width) and extends down to the top surface 156 of the channel film 155. The high-k material 160 lines the opening.

Below the insulator 140, in the embodiment pictured in FIG. 3 are the raised source/drains 120. The raised source/drains are typically formed by an epitaxial process. The epitaxial film can be in-situ doped or ex-situ doped. The height of the raised source/drains may range from about 10 nm to about 50 nm or any other range in between. FIG. 4 shows an embodiment without raised source drains. Other details of the raised source drain materials and dimensions are described in conjunction with method step 30.

Below the raised source/drains 120 and abutting both the channel film 155 and the remaining SOI layer 112' are doped SOI-source/drains 125. Where the doped SOI-source/drains 125 abut the channel 155 and the remaining SOI 112' junctions are formed. The junction of doped SOI-source/drains 125 and channel film 155 is labeled junction 129s. Junction 129s is an abrupt junction. The junction of the doped SOI-source/drains 125 and remaining SOI layer 112' is labeled junction 129. Junction 129 is a diffuse junction. Details of the two junctions were previously described in conjunction with FIGS. 2Q and 2R.

MOSFET Made with Partial-Epi-Grow-Back Process and Raised Source/Drains

Figure 5:
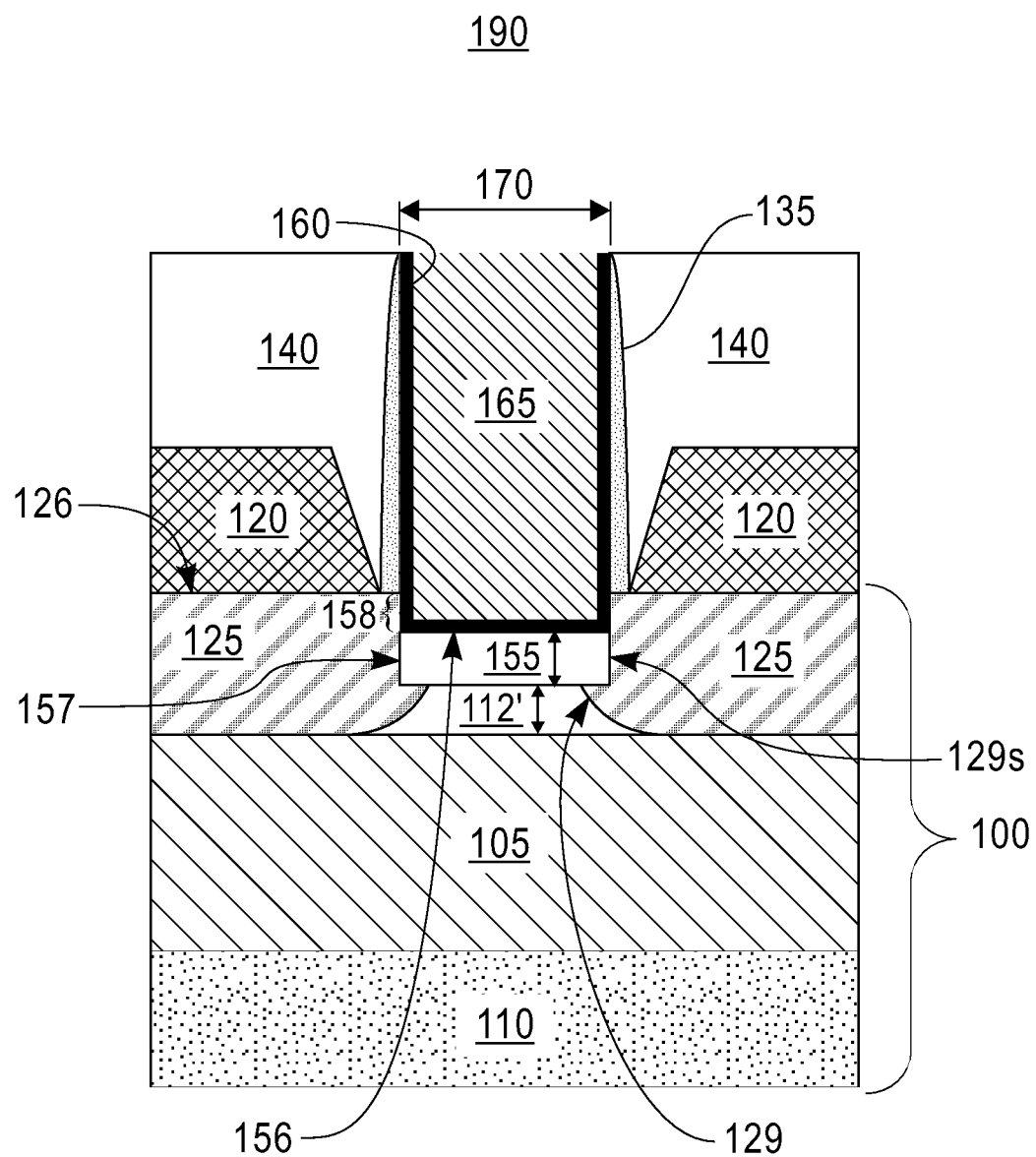
FIG. 5 illustrates a MOSFET with abrupt junctions made by a partial-epi-grow-back embodiment of the invention.

FIG. 5 is a MOSFET with abrupt junctions made by the partial-epi-grow-back process is presented. The features of the MOSFET made by the full-epi-grow-back process and the partial-epi-grow-back process differ in the location of the channel top surface 156. In the partial-epi-grow-back process, rather than being coplanar with the source/drain extension top surface 126, the channel top surface 156 is below the source/drain extension top surface 126 such that there is a step height 158. The step height may range from 1 nm to 10 nm or any other range in between. In a preferred embodiment, the step height is 4 nm, the channel 155 thickness is 4 nm and the remaining SOI layer 112' thickness is 2 nm. Other than the location of the channel top surface 156 and resulting step 158, all other features described in conjunction with a MOSFET formed by the full-epi-grow-back process apply to a MOSFET formed by the partial-epi-grow-back process.

This concludes the description of MOSFETs and substrates with a recessed channel and abrupt junctions. While the present invention has been described with reference to what are presently considered to be the preferred embodiments, it is to be understood that the invention is not limited to the disclosed embodiments. On the contrary, the invention is intended to cover various modifications and equivalent arrangements included within the spirit and scope of the appended claims. In particular, various combinations of off-set spacer use (or not), raised source drain use (or not), and full or partial refill of the recess are within the scope of specification. The scope of the following claims is to be accorded the broadcast interpretation so as to encompass all such modifications and equivalent structures and functions.

The invention claimed is:

1. A metal oxide semiconductor field effect transistor (MOSFET) comprising:
a bottom bulk semiconductor layer;
a buried insulator layer on the bottom bulk semiconductor layer;
a semiconductor on insulator (SOI) layer on the buried insulator layer;
a doped source that extends throughout a thickness of the semiconductor-on-insulator layer;
a doped drain that extends throughout the thickness of the SOI layer;
an insulator layer above the doped source and doped drain;
a channel film disposed between the doped source and the doped drain;
a remaining portion of the SOI layer under the channel film;
an opening in the insulator wherein the opening is above at least a portion of the channel film;
a high dielectric constant material in contact with at least a portion of the channel film; and
a metal gate in contact with the high dielectric constant material;
wherein the channel film abuts the doped source and the doped drain at both side and bottom surfaces thereof to form a sharp channel-source junction and a sharp channel-drain junction; and
wherein the remaining portion of the SOI layer under the channel film abuts the doped source and abuts the doped drain to form a diffuse SOI-source junction and a diffuse SOI-drain junction such that the diffuse junctions have a junction width of about twice that of the sharp junctions along a horizontal orientation of the SOI layer.

2. The MOSFET of claim 1, further comprising:
a gate width which is from about 5 nm to about 25 nm and ranges there between.

3. The MOSFET of claim 1, wherein:
the channel film has a plurality of sidewalls;
the high dielectric constant material has a plurality of outer surfaces; and
at least one of the channel film sidewalls aligns vertically with one of the dielectric constant material outer surfaces.

4. The MOSFET of claim 1, wherein:
the channel film has a channel film width; and
the channel film width is from about 5 nm to about 50 nm and ranges there between.

* * * * *